(12) United States Patent
Kim et al.

(10) Patent No.: US 12,108,645 B2
(45) Date of Patent: Oct. 1, 2024

(54) DISPLAY PANEL AND DISPLAY APPARATUS INCLUDING THE SAME

(71) Applicant: Samsung Display Co., LTD., Yongin-si (KR)

(72) Inventors: Sunghwan Kim, Yongin-si (KR); Wonkyu Kwak, Yongin-si (KR); Youngsoo Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/350,909

(22) Filed: Jul. 12, 2023

(65) Prior Publication Data

US 2023/0354663 A1  Nov. 2, 2023

Related U.S. Application Data

(63) Continuation of application No. 17/240,398, filed on Apr. 26, 2021, now Pat. No. 11,706,961.

(30) Foreign Application Priority Data

May 11, 2020 (KR) .................. 10-2020-0056149

(51) Int. Cl.
*H10K 59/131* (2023.01)
*H10K 59/126* (2023.01)

(52) U.S. Cl.
CPC ......... *H10K 59/131* (2023.02); *H10K 59/126* (2023.02)

(58) Field of Classification Search
None
See application file for complete search history.

(56) References Cited

U.S. PATENT DOCUMENTS

| | | | |
|---|---|---|---|
| 10,304,913 B2 | 5/2019 | Choi et al. | |
| 11,538,880 B2 * | 12/2022 | Choi | H10K 59/122 |
| 2016/0154263 A1 | 6/2016 | Hatsumi et al. | |
| 2017/0154566 A1 | 6/2017 | Ryoo et al. | |
| 2017/0162111 A1 | 6/2017 | Kang et al. | |
| 2017/0176797 A1 | 6/2017 | Kim et al. | |
| 2019/0051670 A1 | 2/2019 | Bei et al. | |
| 2019/0130822 A1 | 5/2019 | Jung et al. | |
| 2019/0227362 A1 | 7/2019 | Sun et al. | |
| 2019/0362678 A1 | 11/2019 | Shin et al. | |

(Continued)

FOREIGN PATENT DOCUMENTS

| | | |
|---|---|---|
| KR | 10-2017-0024182 A | 3/2017 |
| KR | 10-2017-0113066 A | 10/2017 |
| KR | 10-1858825 B1 | 5/2018 |

*Primary Examiner* — Ryan Crockett
(74) *Attorney, Agent, or Firm* — Lewis Roca Rothgerber Christie LLP

(57) ABSTRACT

Provided is a display panel including first bypass wirings electrically coupling main pixel circuits in a first direction, and bypassing along one side of a pixel group at an outermost portion of the component area, horizontal wirings electrically coupled to the main pixel circuits and auxiliary pixel circuits and extending in a first direction, and extension wirings between two pixel groups adjacent to each other along the first direction, and extending in the first direction, wherein the extension wirings are electrically coupled to the horizontal wirings included in each of the two pixel groups, and the number of the extension wirings is less than the number of the horizontal wirings.

20 Claims, 13 Drawing Sheets

(56) References Cited

U.S. PATENT DOCUMENTS

| | | | |
|---|---|---|---|
| 2020/0044006 A1 | 2/2020 | Lee et al. | |
| 2020/0174301 A1* | 6/2020 | Tien | H04M 1/0264 |
| 2020/0364434 A1* | 11/2020 | Bok | G06F 3/0412 |
| 2020/0373372 A1* | 11/2020 | Chung | H10K 77/111 |
| 2021/0013298 A1 | 1/2021 | Her et al. | |
| 2021/0202654 A1* | 7/2021 | Jeong | H10K 59/121 |
| 2021/0216157 A1* | 7/2021 | Jeong | H10K 50/82 |
| 2021/0225958 A1* | 7/2021 | Ko | H10K 59/353 |
| 2022/0045151 A1* | 2/2022 | Jeong | H10K 59/1216 |
| 2022/0155829 A1 | 5/2022 | Lou et al. | |
| 2022/0197074 A1* | 6/2022 | Yin | G02F 1/1347 |
| 2022/0199710 A1 | 6/2022 | Xu et al. | |
| 2023/0200152 A1* | 6/2023 | Choi | H10K 59/126 |
| | | | 257/72 |

* cited by examiner

DISPLAY PANEL AND DISPLAY APPARATUS INCLUDING THE SAME

CROSS-REFERENCE TO RELATED APPLICATION

This application is a continuation of U.S. patent application Ser. No. 17/240,398, filed Apr. 26, 2021, which claims priority to and the benefit of Korean Patent Application No. 10-2020-0056149, filed on May 11, 2020, in the Korean Intellectual Property Office, the entire content of which is hereby incorporated by reference.

BACKGROUND

1. Field

One or more embodiments of the present disclosure relate to a display panel and a display apparatus including the same, and, for example, to a display panel including an expanded display area so as to display an image even in an area in which a component that is an electronic element is positioned, and a display apparatus including the same.

2. Description of Related Art

In recent years, the use of display apparatuses has diversified and increased. In addition, because display apparatuses have become thinner and lighter, their range of use is expanding.

As display apparatuses are used in various ways, there may be various methods for designing the shape of a display apparatus, and functions combined with or linked to display apparatuses are increasing.

SUMMARY

One or more embodiments provide a display panel including an extended display area to display an image even in an area where a component that is an electronic element is positioned, and a display apparatus including the same. However, these features are exemplary, and the scope of the present disclosure is not limited thereby.

Additional aspects of embodiments will be set forth in part in the description which follows and, in part, will be apparent from the description, or may be learned by practice of the presented embodiments.

According to an aspect of embodiments of the disclosure, a display panel may include a substrate, main display elements on the substrate and corresponding to a main display area, and main pixel circuits respectively coupled to the main display elements, auxiliary display elements on the substrate and corresponding respectively to pixel groups, and auxiliary pixel circuits respectively coupled to the auxiliary display elements, first bypass wirings electrically coupling the main pixel circuits in a first direction, and bypassing along one side of one of the pixel groups located at an outermost portion of a component area including the pixel groups spaced apart from each other and comprising a transmission area between the pixel groups, horizontal wirings electrically coupled to the main pixel circuits and the auxiliary pixel circuits and extending in the first direction, and extension wirings between two pixel groups adjacent to each other along the first direction, and extending in the first direction, wherein the extension wirings are electrically coupled to the horizontal wirings included in each of the two pixel groups, and the number of the extension wirings is less than the number of the horizontal wirings.

In an embodiment, the first bypass wirings may be bent in a staircase shape along an inside of the pixel groups at an outermost portion of the component area.

In an embodiment, the first bypass wirings may be bent in a staircase shape along an inside of the pixel groups at an outermost portion of the component area.

In an embodiment, on a plane, a width of an area in which the extension wirings are arranged along a second direction perpendicular (e.g., substantially perpendicular) to the first direction may be smaller than a width of an area in which the horizontal wirings are arranged along the second direction.

In an embodiment, each of the auxiliary pixel circuits may include a driving thin-film transistor, a first initialization thin-film transistor that initializes a voltage of a driving gate electrode of the driving thin-film transistor, and a second initialization thin-film transistor that initializes a pixel electrode of the auxiliary display elements, the horizontal wirings may include a first initialization voltage line that transmits an initialization voltage to the first initialization thin-film transistor, and a second initialization voltage line that transmits the initialization voltage to the second initialization thin-film transistor, and the first initialization voltage line and the second initialization voltage line may be electrically coupled to each other by a first connection line.

In an embodiment, the first connection line may be on a different layer from the horizontal wirings.

In an embodiment, each of the pixel groups may include a first row and a second row in which the auxiliary sub-pixels are arranged along the first direction, a first auxiliary sub-pixel included in the first row and a second auxiliary sub-pixel included in the second row may be adjacent to each other along a second direction perpendicular (e.g., substantially perpendicular) to the first direction, and the second initialization voltage line may be shared by the first auxiliary sub-pixel and the second auxiliary sub-pixel.

In an embodiment, the second initialization voltage line may be electrically coupled to a first initialization thin-film transistor of the second auxiliary sub-pixel.

In an embodiment, the horizontal wirings may further include a third initialization voltage line that crosses the second row in the first direction, and that applies an initialization voltage to a second initialization thin-film transistor of the second auxiliary sub-pixel, and the third initialization voltage line may be electrically coupled to the first connection line.

In an embodiment, the display panel may further include second bypass wires that electrically couple the main pixel circuits in a second direction that intersects the first direction, and that bypass along one side of a pixel group at an outermost portion of the component area.

In an embodiment, the second bypass wires may be bent in a staircase shape.

In an embodiment, the display panel may further include a lower metal layer in the component area, and between the substrate and the auxiliary pixel circuits driving auxiliary sub-pixels, wherein the lower metal layer includes a lower-hole corresponding to the transmission area.

According to an aspect of embodiments of the disclosure, a display apparatus may include a display panel including a main display area including main sub-pixels, and a component area including a plurality of pixel groups and a transmission area, and a component under the display panel to correspond to the component area, wherein the display panel includes a substrate, first bypass wirings electrically coupling the main sub-pixels in a first direction, and bypassing along one side of a pixel group at an outermost portion of the component area, horizontal wirings electrically coupled to the main sub-pixels and the plurality of pixel groups and extending in a first direction, and extension wirings between two of the pixel groups adjacent to each other along the first direction among the plurality of pixel groups, and extending in the first direction, wherein the extension wirings are electrically coupled to the horizontal wirings included in each of the two pixel groups, and the number of the extension wirings is less than the number of the horizontal wirings.

In an embodiment, the first bypass wirings may be bent in a staircase shape along a periphery of the pixel groups at an outermost portion of the component area.

In an embodiment, the first bypass wirings may be bent in a staircase shape along an inside of the pixel groups at an outermost portion of the component area.

In an embodiment, on a plane, a width of an area in which the extension wirings are arranged along a second direction perpendicular (e.g., substantially perpendicular) to the first direction may be smaller than a width of an area in which the horizontal wirings are arranged along the second direction.

In an embodiment, each of the auxiliary pixel circuits may include a driving thin-film transistor, a first initialization thin-film transistor that initializes a voltage of a driving gate electrode of the driving thin-film transistor, and a second initialization thin-film transistor that initializes a pixel electrode of auxiliary display elements, wherein the horizontal wirings includes a first initialization voltage line that transmits an initialization voltage to the first initialization thin-film transistor, and a second initialization voltage line that transmits the initialization voltage to the second initialization thin-film transistor, and the first initialization voltage line and the second initialization voltage line are electrically coupled to each other by a first connection line.

In an embodiment, the first connection line may be on a different layer from the horizontal wirings.

In an embodiment, each of the plurality of pixel groups may include a first row and a second row in which the plurality of auxiliary sub-pixels are arranged along the first direction, a first auxiliary sub-pixel included in the first row and a second auxiliary sub-pixel included in the second row may be adjacent to each other along a second direction perpendicular (e.g., substantially perpendicular) to the first direction, and the second initialization voltage line may be shared by the first auxiliary sub-pixel and the second auxiliary sub-pixel.

In an embodiment, the horizontal wirings may further include a third initialization voltage line that crosses the second row in the first direction, and that applies an initialization voltage to a second initialization thin-film transistor of the second auxiliary sub-pixel, and the third initialization voltage line may be electrically coupled to the first connection line.

BRIEF DESCRIPTION OF THE DRAWINGS

The above and other aspects and features of certain embodiments will be more apparent from the following description taken in conjunction with the accompanying drawings, in which.

DETAILED DESCRIPTION

Figure 1:
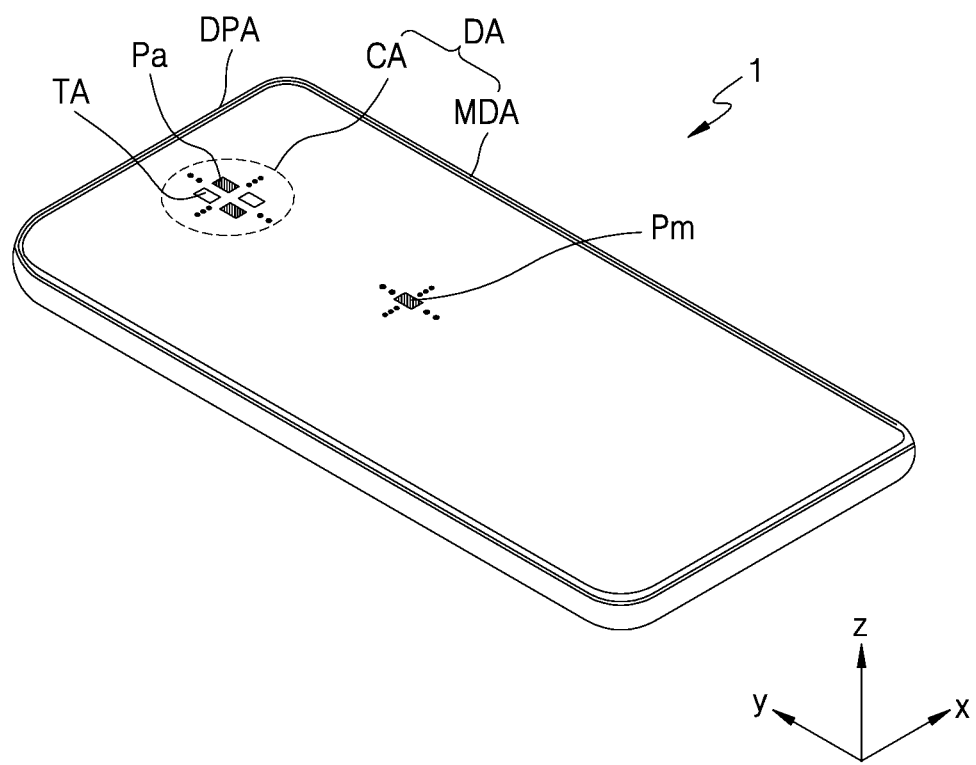
FIG. 1 is a perspective view schematically illustrating a display apparatus, according to an embodiment.

Reference will now be made in more detail to embodiments, examples of which are illustrated in the accompanying drawings, wherein like reference numerals refer to like elements throughout. In this regard, the embodiments may have different forms and are not to be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include a variety of transformations and may include various embodiments, and particular embodiments will be illustrated in the drawings and described in more detail in the detailed description. Effects and features of the disclosure and methods for achieving them will be clarified with reference to embodiments described below in more detail with reference to the drawings. However, the subject matter of the disclosure is not limited to the embodiments disclosed below, but may be implemented in various suitable forms.

Hereinafter, embodiments will be described in more detail with reference to the accompanying drawings, and the same or corresponding components will be given the same reference numerals when describing with reference to the drawings, and redundant description thereof may not be repeated.

In the following embodiments, when various components such as layers, films, areas, plates, etc. are said to be "on" another component, this includes not only when other components are "directly on," but also when other components are therebetween. In addition, for convenience of description, in the drawings, the size of components may be exaggerated or reduced. For example, because the size and thickness of each component shown in the drawings may be arbitrarily shown for convenience of description, the embodiments are not necessarily limited to what is shown.

In the following embodiments, the x-axis, y-axis, and z-axis are not limited to three axes on the Cartesian coordinate system, and may be interpreted in a broad sense including them. For example, the x-axis, y-axis, and z-axis may be orthogonal to each other, but may refer to different directions that are not orthogonal to each other.

FIG. 1 is a perspective view schematically showing a display apparatus 1, according to an embodiment.

Referring to FIG. 1, the display apparatus 1 includes a display area DA, and a peripheral area DPA outside the display area DA. The display area DA includes a component area CA, and a main display area MDA at least partially surrounding the component area CA. For example, each of the component area Ca the main display area MDA may display images individually or together. The peripheral area DPA may be a kind of non-display area in which display elements are not present. The display area DA may be entirely surrounded by the peripheral area DPA.

FIG. 1 shows that one component area CA is in the main display area MDA. In another embodiment, the display apparatus 1 may include two or more component areas CA, and the plurality of component areas CA may be of different shapes and sizes from each other. When viewed in a direction substantially perpendicular to the upper surface of the display apparatus 1, the component area CA may have various suitable shapes including a circle, an ellipse, a polygon such as a rectangle or the like, a star shape, or a diamond shape. In FIG. 1, when viewed from a direction substantially perpendicular to the upper surface of the display apparatus 1, the component area CA is in the upper center of the main display area MDA (+y direction) of a substantially rectangular shape, but the component area CA may be on one side, for example, on the upper right side or upper left side, of the rectangular main display area MDA.

The display apparatus 1 may provide an image using a plurality of main sub-pixels Pm in the main display area MDA and a plurality of auxiliary sub-pixels Pa in the component area CA.

In the component area CA, a component 40, which is an electronic element, may be under the display panel corresponding to the component area CA, as described herein below with reference to FIG. 2. The component 40 may be a camera using infrared rays and/or visible light, and may include an imaging device. In some embodiments, the component 40 may be a solar cell, a flash, an illuminance sensor, a proximity sensor, and/or an iris sensor. In some embodiments, the component 40 may provide a function of receiving audio. In order to reduce the limitation of the function of the component 40, the component area CA includes a transmission area TA through which light and/or audio, etc. output from the component 40 to the outside or proceeding toward the component 40 from the outside may be transmitted. In the case of a display panel and a display apparatus including the same according to an embodiment, when light is transmitted through the component area CA, the light transmittance may be about 10% or more, more 40% or more, 25% or more, 50% or more, 85% or more, or 90% or more.

A plurality of auxiliary sub-pixels Pa may be in the component area CA. The plurality of auxiliary sub-pixels Pa emit light to provide a preset image. An image displayed in the component area CA is an auxiliary image, and may be a lower resolution than an image displayed in the main display area MDA. For example, the component area CA includes a transmission area TA through which light and audio may be transmitted, and when sub-pixels are not on or in the transmission area TA, the number of auxiliary sub-pixels Pa that may be included per unit area may be less than the number of main sub-pixels Pm included per unit area on or in the main display area MDA.

Figure 2:
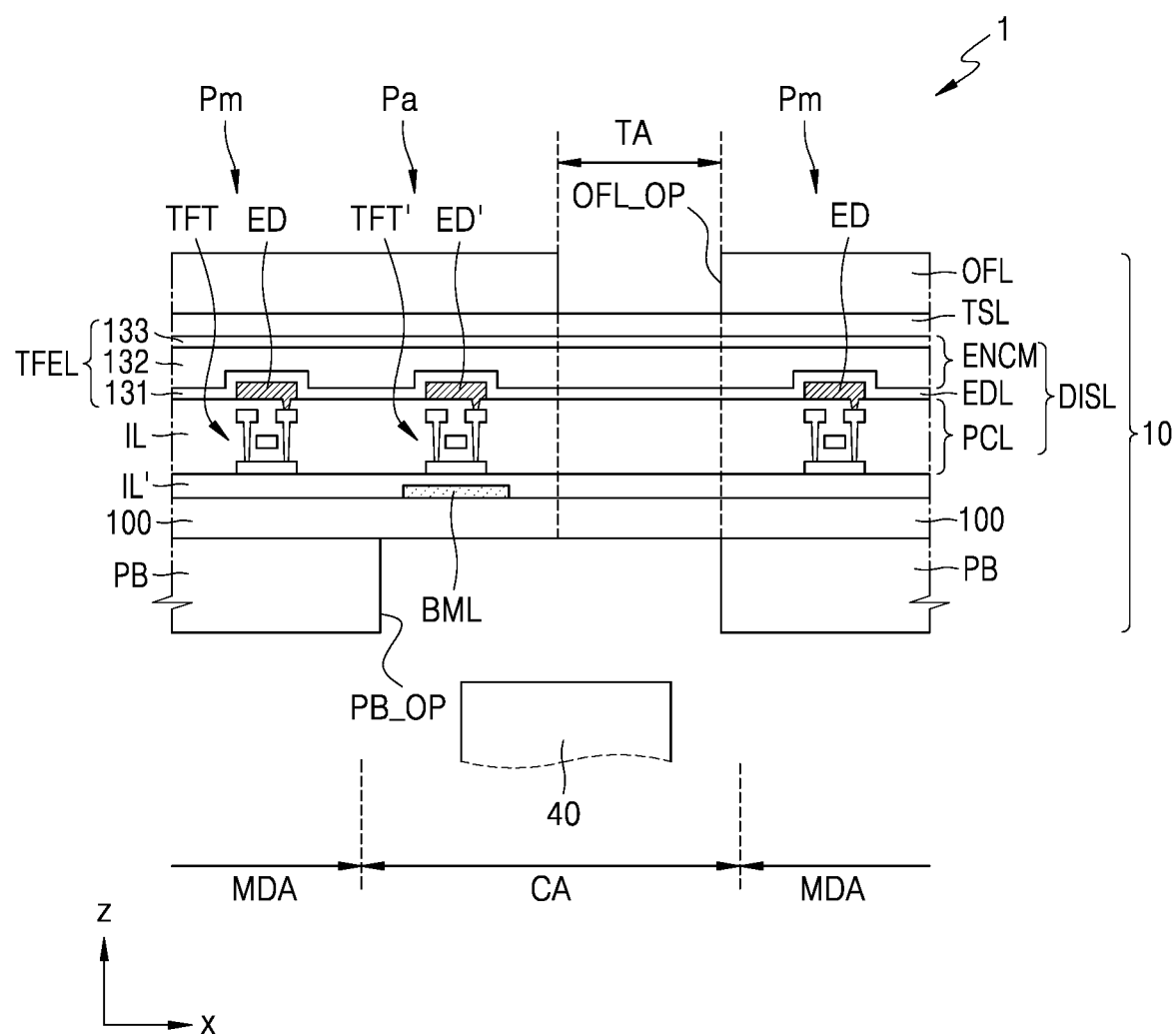
FIG. 2 is a cross-sectional view schematically illustrating part of a display apparatus, according to an embodiment.

FIG. 2 is a cross-sectional view schematically showing a part of the display apparatus 1, according to an embodiment.

Referring to FIG. 2, the display apparatus 1 may include a display panel 10, and a component 40 overlapped with or by the display panel 10. A cover window protecting the display panel 10 may be further positioned on the display panel 10.

The display panel 10 includes a component area CA, an area overlapping the component 40, and a main display area MDA in which a main image is displayed. The display panel 10 may include a substrate 100, a display layer DISL on the substrate 100, a touch screen layer TSL, an optical functional layer OFL, and a panel protection member PB under the substrate 100.

The display layer DISL may include a circuit layer PCL including a thin-film transistor TFT and TFT', a display element layer EDL including a light-emitting element ED and ED' that is a display element, and a sealing member ENCM such as a thin-film encapsulation layer TFEL or a sealing substrate. Between the substrate 100 and the display layer DISL, an insulating layer IL and IL' may be in the display layer DISL.

The substrate 100 may include an insulating material such as glass, quartz, and/or polymer resin. The substrate 100 may be a rigid substrate or a flexible substrate capable of bending, folding, rolling, and/or the like.

A main thin-film transistor TFT and a main light-emitting element ED coupled thereto may be in the main display area MDA of the display panel 10 to implement a main sub-pixel Pm, and in the component area CA, an auxiliary thin-film transistor TFT' and an auxiliary light-emitting device ED' coupled thereto may be included to implement an auxiliary sub-pixel Pa. An area in which an auxiliary sub-pixel Pa is located among the component area CA may be referred to as an auxiliary display area ADA.

In addition, a transmission area TA with no display element may be in the component area CA. The transmission area TA may be an area through which light/signal emitted from the component 40 corresponding to the component area CA and/or light/signal incident on the component 40 is transmitted. The auxiliary display area ADA and the transmission area TA may be alternately arranged in the component area CA.

A lower metal layer BML may be in the component area CA. The lower metal layer BML may be located to correspond to the lower portion of the auxiliary thin-film transistor TFT'. For example, the lower metal layer BML may be between the auxiliary thin-film transistor TFT' and the substrate 100. This lower metal layer BML may block or reduce the penetration of external light to the auxiliary thin-film transistor TFT'. In some embodiments, a constant voltage and/or signal may be applied to the lower metal layer BML to prevent or reduce damage to the pixel circuit due to electrostatic discharge.

The display element layer EDL may be covered with the thin-film encapsulation layer TFEL and/or a sealing substrate. In some embodiments, the thin-film encapsulation layer TFEL may include at least one inorganic encapsulation layer and at least one organic encapsulation layer, as shown in FIG. 2. In an embodiment, the thin-film encapsulation layer TFEL may include first and second inorganic encapsulation layers 131 and 133 and an organic encapsulation layer 132 therebetween.

The first and second inorganic encapsulation layers 131 and 133 may include one or more inorganic insulating materials such as aluminum oxide, titanium oxide, tantalum oxide, hafnium oxide, zinc oxide, silicon oxide, silicon nitride, and/or silicon oxynitride. The organic encapsulation layer 132 may include a polymer-based material. The polymer-based material may include acrylic resin, epoxy resin, polyimide, and/or polyethylene.

When the display element layer EDL is sealed with the sealing substrate, the sealing substrate may face the substrate 100 with the display element layer EDL therebetween. A gap may exist between the sealing substrate and the display element layer EDL. The sealing substrate may include glass. A sealant including a frit and/or the like may be between the substrate 100 and the sealing substrate, and the sealant may be in the peripheral area DPA described above. The sealant placed in the peripheral area DPA may prevent or reduce penetration of moisture through the side surface while surrounding the display area DA.

The touch screen layer TSL may obtain or determine coordinate information according to an external input such as, for example, a touch event. The touch screen layer TSL may include a touch electrode, and touch wires coupled to the touch electrode. The touch screen layer TSL may detect external inputs using a self-capacitance method or a mutual capacitance method.

The touch screen layer TSL may be formed on the thin-film encapsulation layer TFEL. In some embodiments, the touch screen layer TSL may be separately formed on the touch substrate and then combined on the thin-film encapsulation layer TFEL through an adhesive layer such as, for example, optical transparent adhesive OCA. As an embodiment, the touch screen layer TSL may be formed directly on the thin-film encapsulation layer TFEL, and in this case, the adhesive layer may not be between the touch screen layer TSL and the thin-film encapsulation layer TFEL.

The optical functional layer OFL may include an anti-reflection layer. The anti-reflection layer may reduce the reflectance of light (external light) incident from the outside toward the display apparatus 1.

In some embodiments, the optical functional layer OFL may be a polarizing film. The optical functional layer OFL may include an opening OFL_OP corresponding to the transmission area TA. Accordingly, the light transmittance of the transmission area TA may be significantly improved. A transparent material such as, for example, optically clear resin (OCR) may be filled in the opening OFL_OP.

In some embodiments, the optical functional layer OFL may include a filter plate including black matrix and color filters.

A cover window may be on top of the display panel 10 to protect the display panel 10. The optical functional layer OFL may be attached to the cover window by an optically clear adhesive, or may be attached to the touch screen layer TSL by an optically clear adhesive.

The panel protection member PB may be attached to the lower portion of the substrate 100, and may support and protect the substrate 100. The panel protection member PB may include an opening PB_OP corresponding to the component area CA. Through the opening PB_OP included in the panel protection member PB, it is possible to improve the light transmittance of the component area CA. The panel protection cover PB may include polyethyeleneterephthalate (PET) and/or polyimide (PI).

The area of the component area CA may be larger than the area where the component 40 is located. Accordingly, an area of the opening PB_OP provided in the panel protection member PB may not match an area of the component area CA.

In addition, a plurality of components 40 may be in the component area CA. The plurality of components 40 may differ in function from each other. For example, the plurality of components 40 may include at least two of a camera (an imaging device), a solar cell, a flash, a proximity sensor, an illuminance sensor, and/or an iris sensor.

Figure 3:
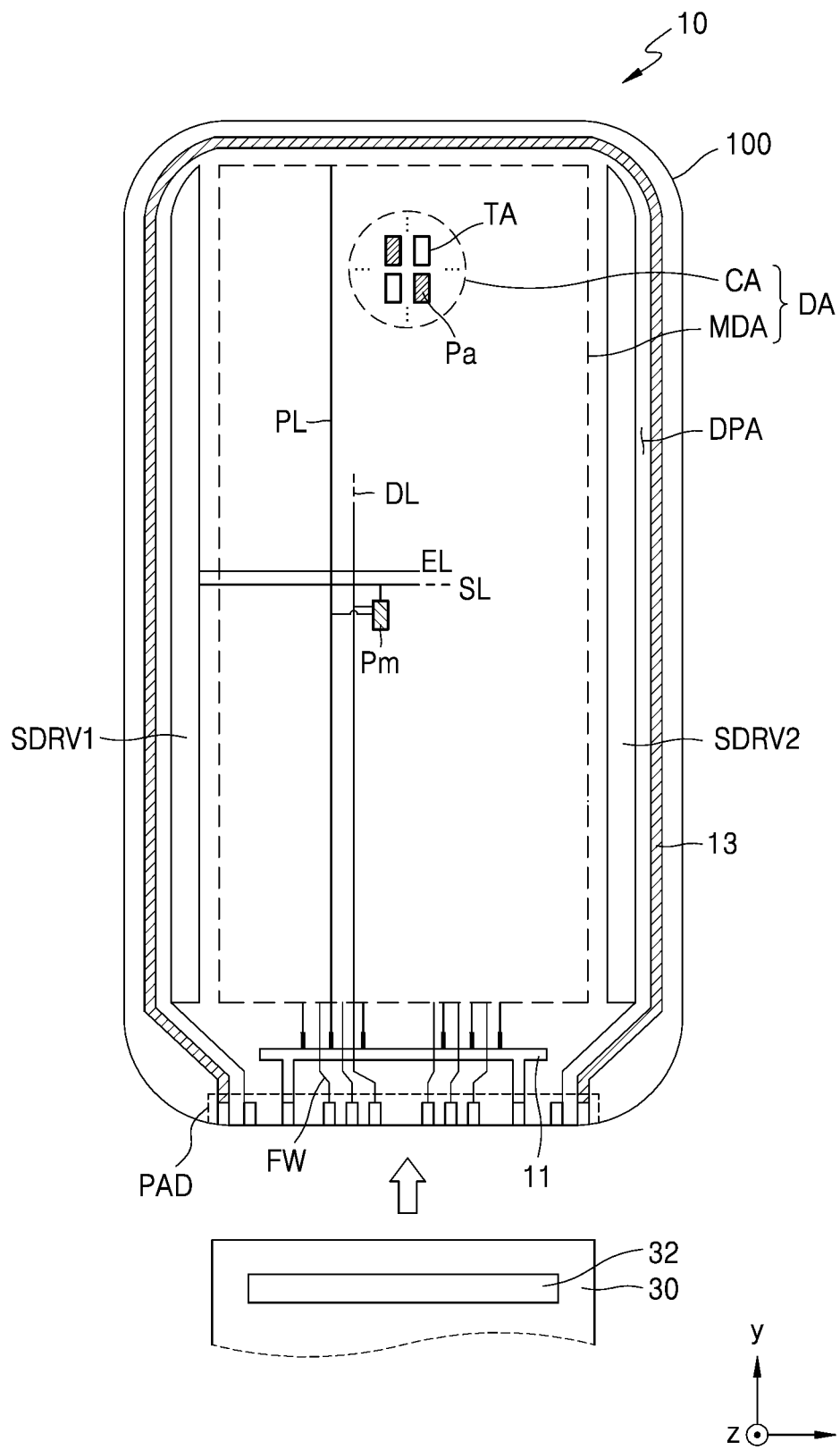
FIG. 3 is a plan view schematically illustrating a display panel that may be included in the display apparatus of FIG. 1, according to an embodiment.

FIG. 3 is a plan view schematically showing the display panel 10, according to an embodiment.

Referring to FIG. 3, various components included in the display panel 10 are on the substrate 100. The substrate 100 includes a display area DA, and a peripheral area DPA surrounding the display area DA. The display area DA includes a main display area MDA in which a main image is displayed, and a component area CA including a transmission area TA and in which an auxiliary image is displayed. The auxiliary image may form one whole image together with the main image, and/or the auxiliary image may be an image independent from the main image.

A plurality of main sub-pixels Pm are included in the main display area MDA. Each of the main sub-pixels Pm may be implemented as a display element such as, for example, an organic light-emitting diode (OLED). Each main sub-pixel Pm may emit red, green, blue or white light, for example. The main display area MDA is covered with a sealing member and may be protected from outside air or moisture by the sealing member.

The component area CA may be on one side of the main display area MDA as described above, or may be inside the display area DA and surrounded by the main display area MDA. A plurality of auxiliary sub-pixels Pa are in the component area CA. Each of the plurality of auxiliary sub-pixels Pa may be implemented by (or included in) a display element such as an organic light-emitting diode (OLED). The respective auxiliary sub-pixels Pa may emit red, green, blue or white light, for example. The component area CA is covered with a sealing member and may be protected from outside air or moisture by the sealing member.

In some embodiments, the component area CA may include a transmission area TA. The transmission area TA may surround the plurality of auxiliary sub-pixels Pa. In some embodiments, the transmission area TA may be in a grid shape with the plurality of auxiliary sub-pixels Pa.

Because the component area CA includes the transmission area TA, the resolution of the component area CA may be lower than that of the main display area MDA. For example, the resolution of the component area CA may be about ½, ⅜, ⅓, ¼, ⅔, ⅛, ⅑, 1/16, etc. of the resolution of the main display area MDA. For example, the resolution of the main display area MDA may be about 400 ppi or more, and the resolution of the component area CA may be about 200 ppi or about 100 ppi (e.g., 200 ppi or less, or 100 ppi or less).

The pixel circuits driving the sub-pixels Pm and Pa may be electrically coupled to the outer circuits in the peripheral area DPA, respectively. A first scan-driving circuit SDRV1, a second scan-driving circuit SDRV2, a terminal unit PAD, a driving-voltage supply line 11 and a common-voltage supply line 13 may be included in the peripheral area DPA.

The first scan-driving circuit SDRV1 may apply a scan signal to each of pixel circuits driving the sub-pixels Pm and Pa through a second scan line SL. The first scan-driving circuit SDRV1 may apply an emission control signal to each pixel circuit through an emission control line EL. The second scan-driving circuit SDRV2 may be on the opposite side of the first scan-driving circuit SDRV1 around the main display area MDA, and may be approximately parallel to the first scan-driving circuit SDRV1. Some of the pixel circuits of the main sub-pixels Pm of the main display area MDA may be electrically coupled to the first scan-driving circuit SDRV1, and the others may be electrically coupled to the second scan-driving circuit SDRV2. Some of the pixel circuits of the auxiliary sub-pixels Pa of the component area CA may be electrically coupled to the first scan-driving circuit SDRV1, and the others may be electrically coupled to the second scan-driving circuit SDRV2. In some embodiments, the second scan-driving circuit SDRV2 may be omitted.

The terminal unit PAD may be on one side of the substrate 100. The terminal unit PAD is exposed without being covered by an insulating layer and is coupled to a display circuit board 30. A display driver 32 may be on the display circuit board 30.

The display driver 32 may generate control signals to be transmitted to the first scan-driving circuit SDRV1 and the second scan-driving circuit SDRV2. The display driver 32 generates a data signal, and the generated data signal may be transmitted to a pixel circuit of the sub-pixels Pm and Pa through a fan-out wiring FW and a data line DL coupled to the fan-out wiring FW.

The display driver 32 may supply a driving voltage ELVDD to the driving-voltage supply line 11 and a common voltage ELVSS to the common-voltage supply line 13. The driving voltage ELVDD is applied to the pixel circuit of the sub-pixels Pm and Pa through a driving voltage line PL coupled to driving-voltage supply line 11, and the common voltage ELVSS may be coupled to the common-voltage supply line 13 and applied to a counter electrode of a display element.

The driving-voltage supply line 11 may extend in the x direction at the bottom of the main display area MDA. The common-voltage supply line 13 is a shape in which one side of a loop shape is open, and may partially surround the main display area MDA.

Although FIG. 3 shows a case where one component area CA is present, a plurality of component areas CA may be provided. In this case, the plurality of component area CA may be spaced apart from each other, and a first camera may be located corresponding to one component area CA, and a second camera may be located corresponding to another component area CA. In some embodiments, a camera may be located corresponding to one component area CA, and an infrared sensor may be located corresponding to another component area CA. The plurality of component areas CA may be provided in different shapes and sizes.

In some embodiments, the component area CA may be provided as a polygon. For example, the component area CA may be provided in an octagonal shape. The component area CA may be provided in a polygonal shape of various suitable shapes such as, for example, a square or a hexagon, but the present disclosure is not limited thereto. The component area CA may be surrounded by the main display area MDA.

Figure 4:
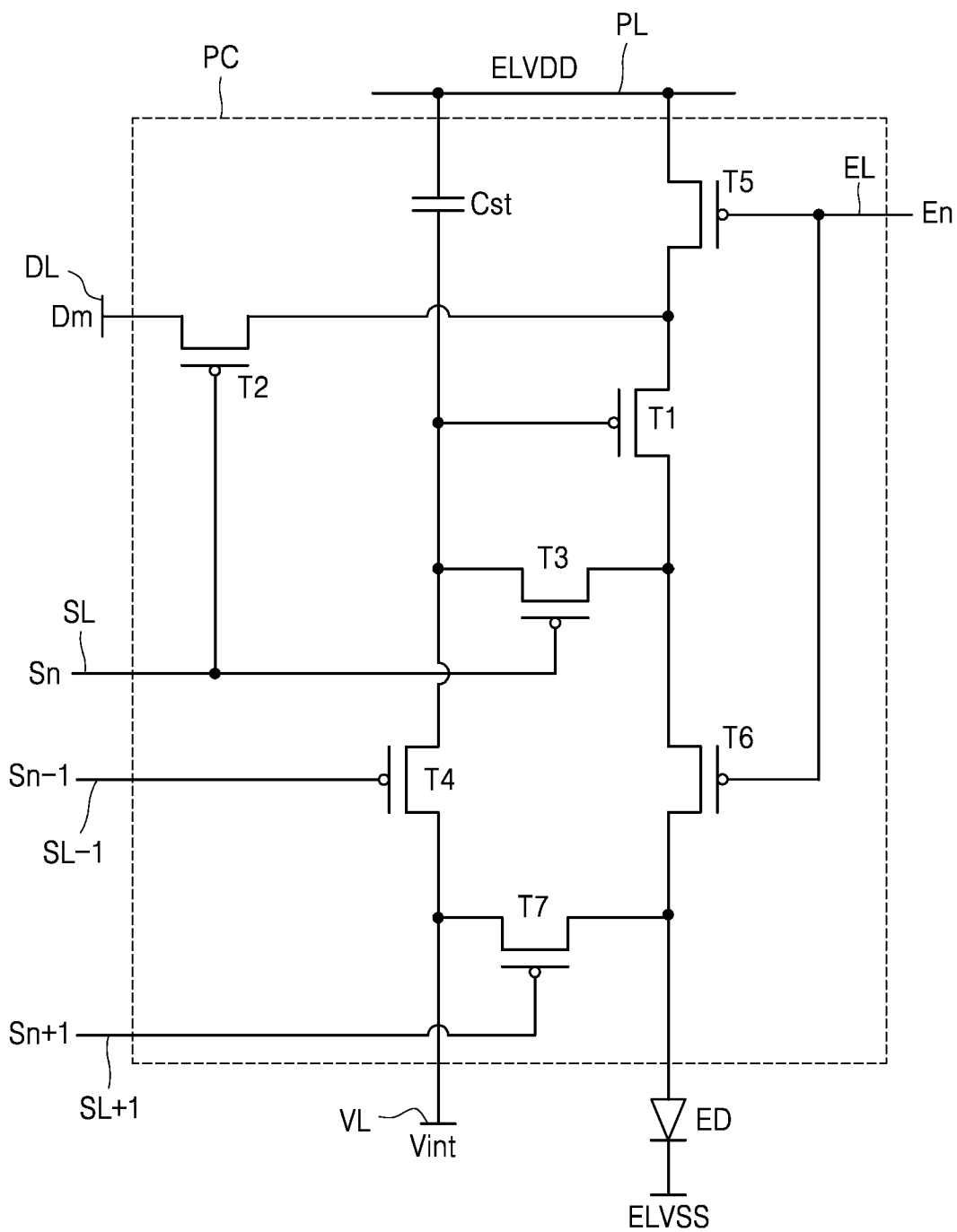
FIG. 4 is an equivalent circuit diagram of a pixel circuit for driving a sub-pixel, according to an embodiment.

FIG. 4 is an equivalent circuit diagram of a pixel circuit for driving a sub-pixel, according to an embodiment.

Referring to FIG. 4, a pixel circuit PC may include a driving thin-film transistor T1, a switching thin-film transistor T2, a compensation thin-film transistor T3, a first initialization thin-film transistor T4, an operation control thin-film transistor T5, an emission control thin-film transistor T6, a second initialization thin-film transistor T7, and a storage capacitor Cst.

In FIG. 4, each pixel circuit PC includes signal lines SL, SL−1, SL+1, EL, and DL, an initialization voltage line VL, and a driving voltage line PL, but the example is not limited thereto. As another embodiment, at least one selected from the signal lines SL, SL−1, SL+1, EL, and DL, and/or the initialization voltage line VL may be shared with neighboring pixel circuits.

A drain electrode of the driving thin-film transistor T1 may be electrically coupled to an emission device ED via the emission control thin-film transistor T6. The driving thin-film transistor T1 may receive a data signal Dm according to a switching operation of a switching thin-film transistor T2 to supply driving current to the emission device ED.

A gate electrode of the switching thin-film transistor T2 is coupled to the second scan line SL, and a source electrode is coupled to the data line DL. A drain electrode of the switching thin-film transistor T2 may be coupled to the driving voltage line PL via an operation control thin-film transistor T5 while being coupled to the source electrode of the driving thin-film transistor T1.

The switching thin-film transistor T2 is turned on according to a scan signal Sn transmitted through the second scan line SL to perform a switching operation to transmit the data signal Dm transferred to the data line DL to the source electrode of the driving thin-film transistor T1.

A gate electrode of the compensation thin-film transistor T3 may be coupled to the second scan line SL. A source electrode of the compensation thin-film transistor T3 may be coupled to a pixel electrode of emission device ED via the emission control thin-film transistor T6 while being coupled to the drain electrode of driving thin-film transistor T1. A drain electrode of the compensation thin-film transistor T3 may be coupled to any one electrode of the storage capacitor Cst, a source electrode of the first initialization thin-film transistor T4, and a gate electrode of the driving thin-film transistor T1 together. The compensation thin-film transistor T3 is turned on according to a scan signal Sn received through the second scan line SL, and couples the gate electrode and drain electrode of the driving thin-film transistor T1 to diode-connect the driving thin-film transistor T1.

A gate electrode of the first initialization thin-film transistor T4 may be coupled to a first scan line SL−1. A drain electrode of the first initialization thin-film transistor T4 may be coupled to the initialization voltage line VL. A source electrode of the first initialization thin-film transistor T4 may be coupled to any electrode of the storage capacitor Cst, the drain electrode of the compensation thin-film transistor T3, and the gate electrode of the driving thin-film transistor T1 together. The first initialization thin-film transistor T4 is turned on according to the previous scan signal Sn−1 received through the first scan line SL−1, and transmits an initialization voltage Vint to the gate electrode of the driving thin-film transistor T1 to perform an initialization operation for initializing a voltage of the gate electrode of the driving thin-film transistor T1.

A gate electrode of the operation control thin-film transistor T5 may be coupled to the emission control line EL. A source electrode of the operation control thin-film transistor T5 may be coupled to the driving voltage line PL. A drain electrode of operation control thin-film transistor T5 is coupled to the source electrode of driving thin-film transistor T1 and the drain electrode of the switching thin-film transistor T2.

A gate electrode of the emission control thin-film transistor T6 may be coupled to the emission control line EL. A source electrode of the emission control thin-film transistor T6 may be coupled to the drain electrode of the driving thin-film transistor T1 and the source electrode of the compensation thin-film transistor T3. The drain electrode of the emission control thin-film transistor T6 may be electrically coupled to the pixel electrode of emission device ED. The operation control thin-film transistor T5 and the emission control thin-film transistor T6 are turned on concurrently (e.g., simultaneously) according to an emission control signal En received through the emission control line EL, and the driving voltage ELVDD is transmitted to the emission device ED, and driving current flows in the emission device ED.

A gate electrode of the second initialization thin-film transistor T7 may be coupled to a third scan line SL+1. A source electrode of the second initialization thin-film transistor T7 may be coupled to a pixel electrode of the emission device ED. A drain electrode of the second initialization thin-film transistor T7 may be coupled to the initialization voltage line VL. The second initialization thin-film transistor T7 may be turned on according to a subsequent scan signal Sn+1 received through the third scan line SL+1, and initialize the pixel electrode of the emission device ED.

In FIG. 4, the first initialization thin-film transistor T4 and the second initialization thin-film transistor T7 are coupled to the first scan line SL−1 and the third scan line SL+1, respectively, but it is not limited thereto. As another embodiment, the first initialization thin-film transistor T4 and the second initialization thin-film transistor T7 may be both coupled to the first scan line SLn−1 and be driven according to the previous scan signal Sn−1.

The other electrode of the storage capacitor Cst may be coupled to the driving voltage line PL. One electrode of the storage capacitor Cst may be coupled to the gate electrode of the driving thin-film transistor T1, the drain electrode of the compensation thin-film transistor T3, and the source electrode of the first initialization thin-film transistor T4.

The counter electrode (e.g., cathode) of the emission device ED receives the common voltage ELVSS. The emission device ED emits light by receiving a driving current from the driving thin-film transistor T1.

The pixel circuit PC is not limited to the number of thin-film transistors and storage capacitors and circuit design described with reference to FIG. 4, and the number and circuit design may be variously changed. The pixel circuit PC driving a main sub-pixel Pm and an auxiliary sub-pixel Pa may be provided identically (e.g., may be substantially identical to each other) or may be provided differently (e.g., may be different from each other).

Figure 5:
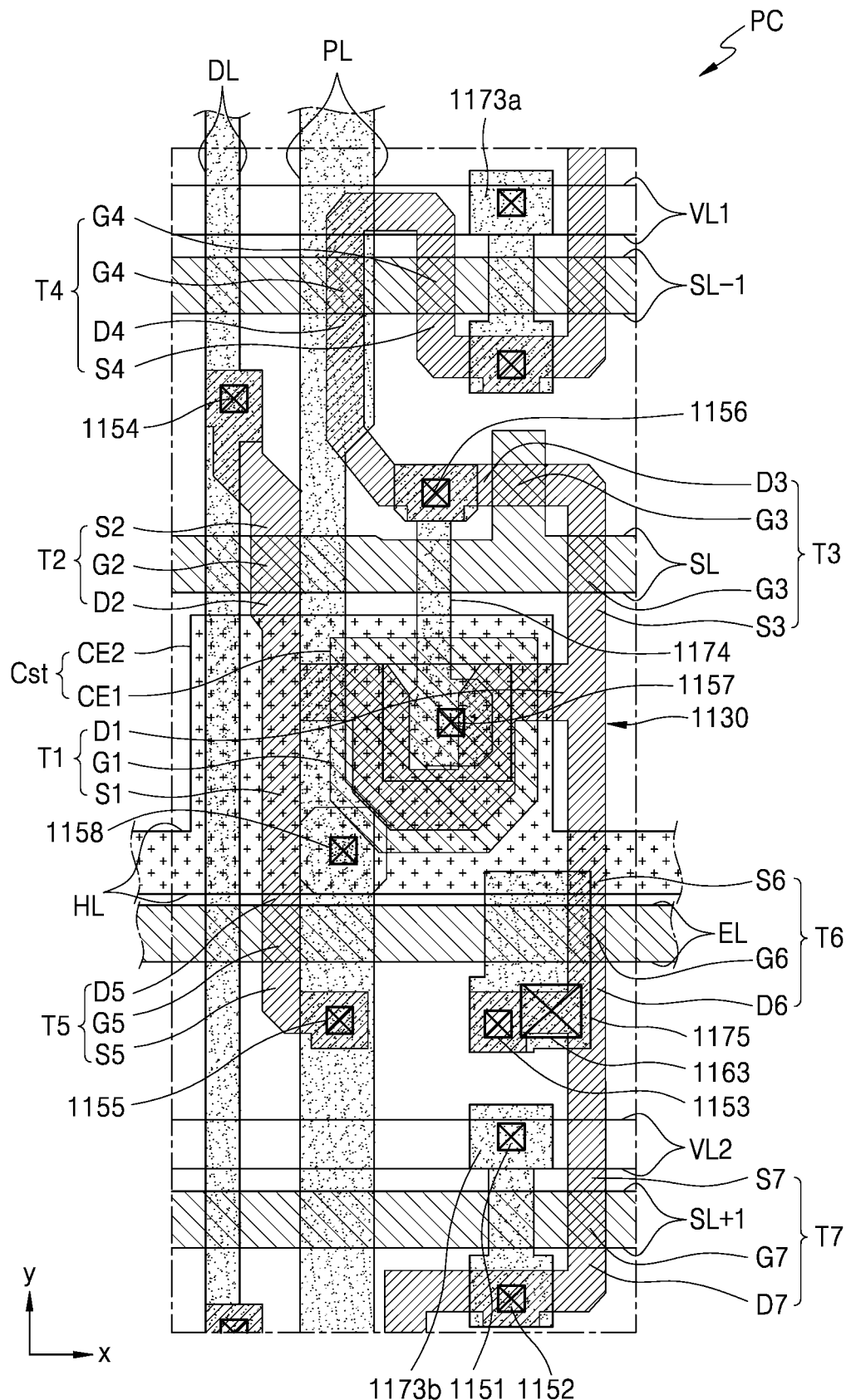
FIG. 5 is a plan view illustrating a pixel circuit of one pixel, according to an embodiment.

FIG. 5 is a plan view illustrating a pixel circuit of one pixel, according to an embodiment.

Referring to FIG. 5, a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7 are arranged along a semiconductor layer 1130. The semiconductor layer 1130 is on a substrate on which a buffer layer, which includes an inorganic insulating material, is formed.

Some areas of the semiconductor layer 1130 correspond to semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. For example, it should be understood that the semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 are coupled to each other and are curved in various suitable shapes.

The semiconductor layer 1130 includes a channel area, and includes a source area and a drain area at opposite sides of the channel area, and the source area and the drain area may be understood as source and drain electrodes of the corresponding thin-film transistor. For convenience, the source area and the drain area are referred to as a source electrode and a drain electrode, respectively.

The driving thin-film transistor T1 includes a driving gate electrode G1 overlapping a driving channel area, and includes a driving source electrode S1 and a driving drain electrode D1 at opposite sides of a driving channel area. The driving channel area overlapping the driving gate electrode G1 has a curved shape such as, for example, an omega shape, so that a long channel length may be formed in a narrow space. When the driving channel area is long, a driving range of the gate voltage is widened, so that the gradation of light emitted from the organic light-emitting diode OLED, which is an emission device, may be more precisely controlled, and thus, the display quality may be improved.

The switching thin-film transistor T2 includes a switching gate electrode G2 overlapping a switching channel area, and includes a switching source electrode S2 and a switching drain electrode D2 at opposite sides of the switching channel area. The switching drain electrode D2 may be coupled to the driving source electrode S1.

The compensation thin-film transistor T3 is a dual thin-film transistor, and may include compensation gate electrodes G3 overlapping two compensation channel areas, and may include a compensation source electrode S3 and a compensation drain electrode D3 that are at opposite sides of each of the compensation gate electrodes. The compensation thin-film transistor T3 may be coupled to the driving gate electrode G1 of the driving thin-film transistor T1 through a node connection line 1174 to be described later.

The first initialization thin-film transistor T4 is a dual thin-film transistor, and may include a first initialization gate electrode G4 overlapping two first initialization channel areas, and may include a first initialization source electrode S4 and a first initialization drain electrode D4 that are at opposite sides off the first initialization gate electrode G4.

The operation control thin-film transistor T5 may include an operation-control gate electrode G5 overlapping an operation-control channel area, and may include an operation-control source electrode S5 and an operation-control drain electrode D5 which are at opposite sides of the operation-control gate electrode G5. The operation-control drain electrode D5 may be coupled to the driving source electrode S1.

The emission control thin-film transistor T6 may include an emission-control gate electrode G6 overlapping an emission-control channel area, and may include an emission control source electrode S6 and an emission-control drain electrode D6 which are at opposite sides of the emission-control gate electrode G6. The emission-control source electrode S6 may be coupled to the driving drain electrode D1.

The second initialization thin-film transistor T7 may include a second initialization gate electrode G7 overlapping a second initialization channel area, and may include a second initialization source electrode S7 and a second initialization drain electrode D7 which are at opposite sides of the second initialization gate electrode G7.

The above-described thin-film transistors may be coupled to the signal lines SL, SL−1, SL+1, EL, and DL, the initialization voltage lines VL1 and VL2, and the driving voltage line PL.

The second scan line SL, the first scan line SL−1, the emission control line EL, and the driving gate electrode G1 may be on the semiconductor layer 1130 described above with the insulating layer(s) therebetween.

The second scan line SL may extend along the x-direction. Some areas of the second scan line SL may correspond to a switching gate electrode G2 and a compensation gate electrode G3. For example, areas of the second scan line SL overlapping channel areas of the switching thin-film transistor T2 and the compensation thin-film transistor T3 may be the switching gate electrode G2 and the compensation gate electrode G3, respectively.

The first scan line SL−1 extends along the x direction, but some areas may respectively correspond to the first initialization gate electrode G4. For example, each of areas of the first scan line SL−1 that overlap with channel areas of the first initialization thin-film transistor T4 may be the first initialization gate electrode G4.

The third scan line SL+1 extends along the x direction, but some areas may respectively correspond to the second initialization gate electrode G7. For example, each of areas of the third scan line SL+1 overlapping with channel areas of the second initialization thin-film transistor T7 may be the second initialization gate electrode G7.

The emission control line EL extends along the x direction. One or more areas of the emission-control line EL may correspond to an operation-control gate electrode G5 and an emission-control gate electrode G6, respectively. For example, areas of the emission-control line EL that overlap channel areas of the operation-control driving thin-film transistor T6 and the emission-control driving thin-film transistor T7 may be the operation-control gate electrode G5 and the emission-control gate electrode G6, respectively.

The driving gate electrode G1 is a floating electrode and may be coupled to the compensation thin-film transistor T3 through the node connection line 1174 described above.

On the first scan line SL−1, the second scan line SL, the third scan line SL+1, the emission-control line EL, and the driving gate electrode G1 described above, an electrode voltage line HL may be arranged with an insulating layer(s) therebetween.

The electrode voltage line HL may extend along the x direction to intersect the data line DL and the driving voltage line PL. A portion of the electrode voltage line HL covers at least a portion of the driving gate electrode G1 and may form a storage capacitor Cst together with the driving gate electrode G1. For example, the driving gate electrode G1 may be a lower electrode CE1 of the storage capacitor Cst, and a portion of the electrode voltage line HL may be an upper electrode CE2 of the storage capacitor Cst.

The upper electrode CE2 of the storage capacitor Cst is electrically coupled to the driving voltage line PL. In this regard, the electrode voltage line HL may be coupled to the driving voltage line PL on the electrode voltage line HL through a contact hole. Therefore, the electrode voltage line HL may be of the same (e.g., substantially the same) voltage level (constant voltage) as the driving voltage line PL. For example, the electrode voltage line HL may be of a constant voltage of +5V. The electrode voltage line HL may be understood as a transverse driving voltage line.

The driving voltage line PL extends along the y direction, and the electrode voltage line HL electrically coupled to the driving voltage line PL extends along the x direction crossing the y direction, so a plurality of driving voltage lines PL and electrode voltage lines HL in the display area may achieve a mesh structure.

The data line DL, the driving voltage line PL, initialization connection lines 1173*a* and 1173*b*, and the node connection line 1174 may be on the electrode voltage line HL with an insulating layer(s) therebetween.

The data line DL extends in the y direction and may be coupled to the switching source electrode S2 of the switching thin-film transistor T2 through a contact hole 1154. Part of the data line DL may be understood as a switching source electrode.

The driving voltage line PL extends in the y direction, and is coupled to the electrode voltage line HL through the contact hole CNT as described above. In addition, the driving voltage line PL may be coupled to the operation control thin-film transistor T5 through a contact hole 1155. The driving voltage line PL may be coupled to the operation-control drain electrode D5 through the contact hole 1155.

The first initialization voltage line VL1 may be coupled to the first initialization thin-film transistor T4 through the first initialization connection line 1173*a*, and the second initialization voltage line VL2 may be coupled to the second initialization thin-film transistor T7 through the second initialization connection line 1173*b*. Meanwhile, the first initialization voltage line VL1 and the second initialization voltage line VL2 may be electrically coupled to each other by a coupling member and may be of a constant voltage (e.g., −2V, etc.).

One end of the node connection line 1174 may be coupled to the compensation drain electrode D3 through a contact hole 1156, and the other end may be coupled to the driving gate electrode G1 through a contact hole 1157.

The initialization voltage line VL may be on the data line DL, the driving voltage line PL, the initialization connection line 1173, and the node connection line 1174 with an insulating layer(s) therebetween.

The initialization voltage lines VL1 and VL2 are on the same layer as a pixel electrode 121 (see FIG. 8) of the organic light-emitting diode OLED and may include the same (e.g., substantially the same) material. A pixel electrode may be coupled to the emission control thin-film transistor T6. The pixel electrode may be coupled to a connection electrode CM through a contact hole 1163, and the connection electrode CM may be coupled to the emission-control drain electrode D6 through a contact hole 1153. In some embodiments, the initialization voltage lines VL1 and VL2 may be on the same layer as the electrode voltage line HL.

Figure 6:
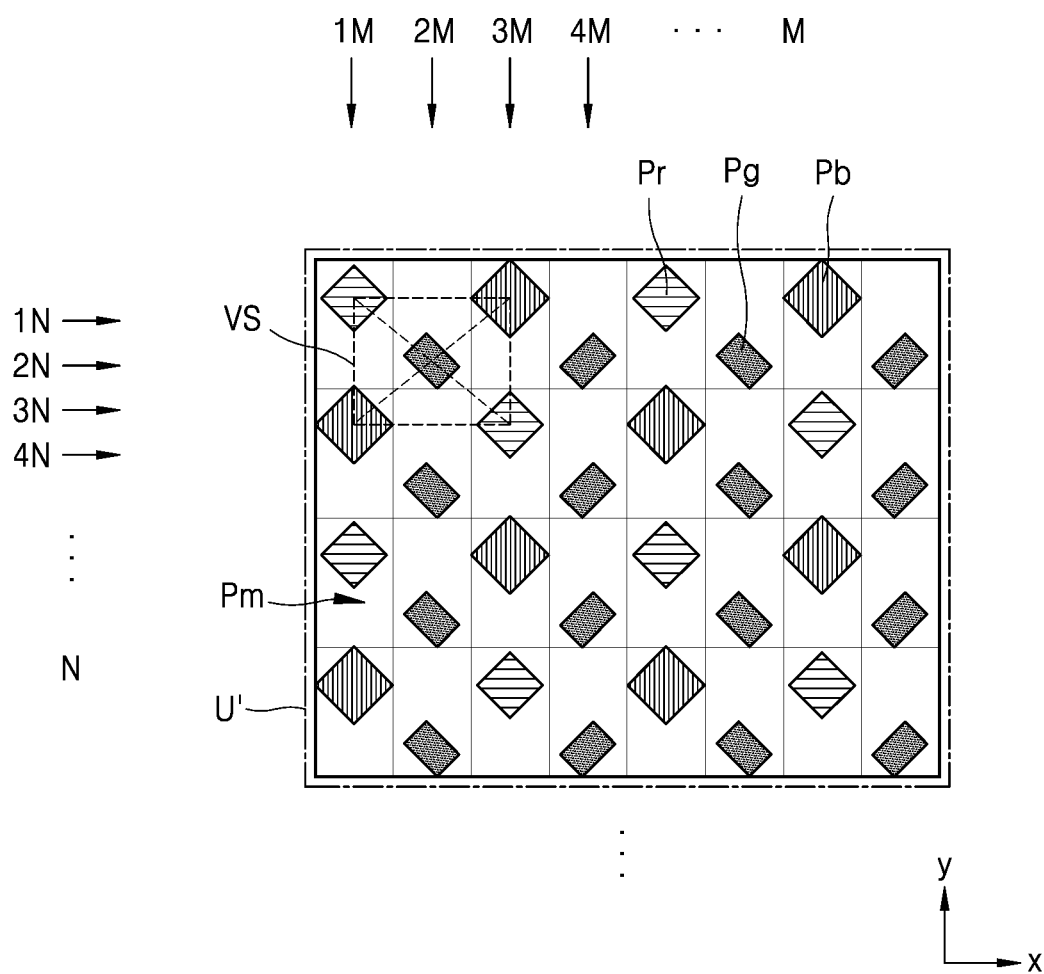
FIG. 6 is a layout diagram schematically illustrating a pixel arrangement structure in a main display area, according to an embodiment.

FIG. 6 is a layout diagram schematically illustrating a pixel arrangement structure in the main display area, according to an embodiment.

A plurality of main sub-pixels Pm may be in a main display area MDA. In this specification, a sub-pixel refers to an emitting area as a basic unit (e.g., a minimum unit) for realizing an image (or for emitting light). On the other hand, when an organic light-emitting diode is used as a display element, the emitting area may be defined by an opening of a pixel-defining layer. This will be further described herein below.

As shown in FIG. 6, main sub-pixels Pm in the main display area MDA may be arranged in a pentile structure. A red sub-pixel Pr, a green sub-pixel Pg, and a blue sub-pixel Pb may implement red, green, and blue, respectively.

A plurality of red sub-pixels Pr and a plurality of blue sub-pixels Pb are alternately arranged in a first row 1N, in an adjacent second row 2N, a plurality of green sub-pixels Pg are spaced apart at a preset interval, in an adjacent third row 3N, the blue sub-pixel Pb and the red sub-pixel Pr are alternately arranged, and in an adjacent fourth row 4N, the plurality of green sub-pixels Pg are spaced apart at a preset interval, and the arrangement of such pixels is repeated up to an Nth row. In some embodiments, the blue sub-pixel Pb and the red sub-pixel Pr may be provided larger than the green sub-pixel Pg.

The plurality of red sub-pixels Pr and blue sub-pixels Pb each in the first row 1N and the plurality of green sub-pixels Pg in the second row 2N are staggered. Therefore, the red sub-pixel Pr and the blue sub-pixel Pb are alternately arranged in the first column 1M, and the plurality of green sub-pixels Pg are arranged at a preset interval in an adjacent second column 2M, the blue sub-pixel Pb and red sub-pixel Pr are alternately arranged in an adjacent third column 3M, and the plurality of green sub-pixels Pg are arranged at a preset interval in an adjacent fourth column 4M, and this arrangement of pixels is repeated up to an Mth column.

When the pixel arrangement structure is expressed differently, the red sub-pixel Pr is at first and third vertices facing each other among vertices of a virtual square VS with the center point of the green sub-pixel Pg as the center point of the rectangle, and the blue sub-pixel Pb is at second and fourth vertices which are the remaining vertices. At this time, the virtual square VS may be variously modified to form a shape such as, for example, a rectangle, a rhombus, or a square.

Such a pixel arrangement structure is called a pentile matrix structure or a pentile structure, and high resolution may be realized with a small number of pixels by applying a rendering driving method that expresses colors by sharing adjacent pixels.

In FIG. 6, the plurality of main sub-pixels Pm are arranged in a pentile matrix structure, but the disclosure is not limited thereto. For example, the plurality of main sub-pixels Pm may be arranged in various suitable shapes such as, for example, a stripe structure, a mosaic array structure, or a delta array structure.

Figure 7A:
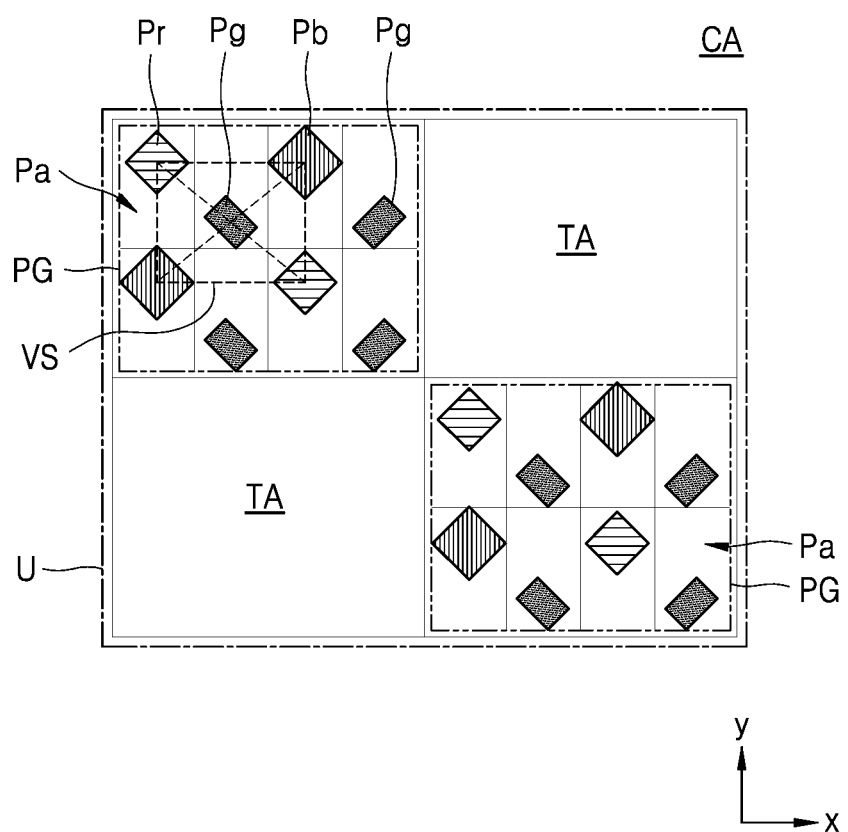
FIGS. 7A and 7B are layout diagrams schematically showing a pixel arrangement structure in a component area, according to embodiments.
Figure 7B:
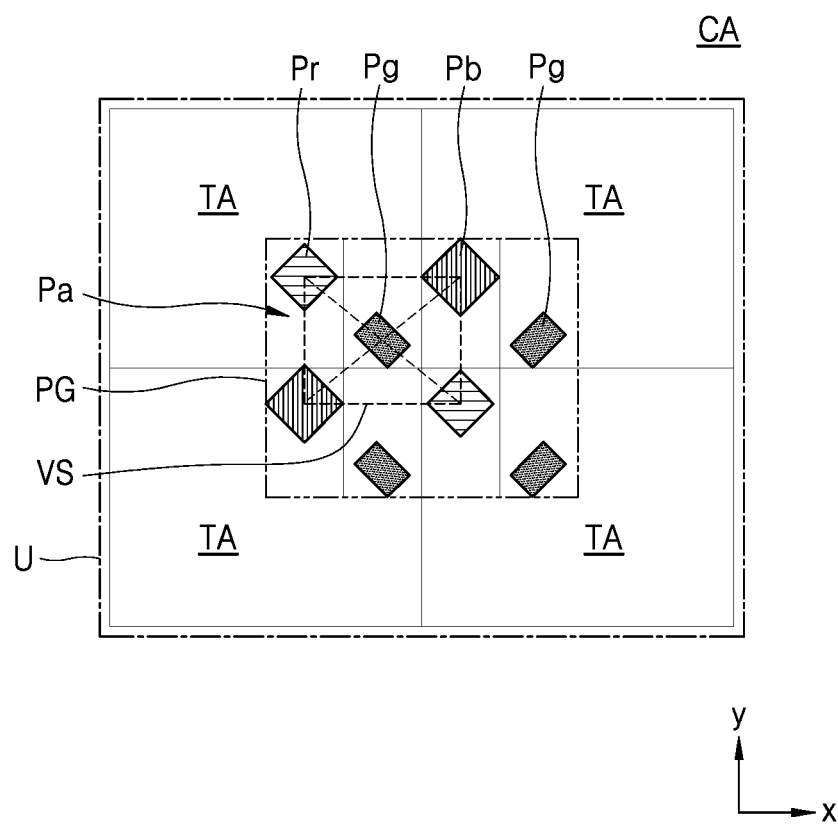

FIGS. 7A and 7B are layout diagrams schematically showing a pixel arrangement structure in a component area CA, according to an embodiment.

Referring to FIG. 7A, a plurality of auxiliary sub-pixels Pa may be in the component area CA. Each of the auxiliary sub-pixel Pa may emit light of any one selected from red, green, blue, and white.

The component area CA may include a pixel group PG including at least one auxiliary sub-pixel Pa, and a transmission area TA. The pixel group PG and the transmission area TA are alternately arranged along the x direction and the y direction, and for example, may be arranged in a lattice shape. In some embodiments, the component area CA may include a plurality of pixel groups PG and a plurality of transmission areas TA.

The pixel group PG may be defined as a sub-pixel aggregate in which a plurality of auxiliary sub-pixels Pa are grouped in preset units. For example, as shown in FIG. 7A, one pixel group PG may include eight auxiliary sub-pixels Pa arranged in a pentile structure. In some embodiments, one pixel group PG may include two red sub-pixels Pr, four green sub-pixels Pg, and two blue sub-pixels Pb.

In the component area CA, a basic unit U in which a preset number of pixel groups PG and a preset number of transmission areas TA are bound may be repeatedly arranged in the x direction and the y direction. In FIG. 8A, the basic unit U may be a shape in which two pixel groups PG and two transmission areas TA arranged around the two pixel groups PG are bound in a square shape. The basic unit U is a division of repetitive shapes, and does not mean a break in the composition.

In the main display area MDA, a corresponding unit U' provided with the same (e.g., substantially the same) area as the area of the basic unit U may be set. In some embodiments, the number of main sub-pixels Pm included in the corresponding unit U' may be larger than the number of auxiliary sub-pixels Pa included in the basic unit U. For example, the number of auxiliary sub-pixels Pa included in the basic unit U is 16, and the number of main sub-pixels Pm included in the corresponding unit U' is 32, where the number of auxiliary sub-pixels Pa and the number of main sub-pixels Pm may be provided in a ratio of 1:2.

The arrangement structure of auxiliary sub-pixels Pa as shown in FIG. 7A is a pentile structure, and the pixel arrangement structure of the component area CA of which a resolution is provided ½ as compared to the main display area MDA is called a ½ pentile structure. The number or arrangement of auxiliary sub-pixels Pa included in the pixel group PG may be modified according to a resolution of the component area CA.

Referring to FIG. 7B, the pixel arrangement structure of the component area CA may be provided in a ¼ pentile structure. In this embodiment, eight auxiliary sub-pixels Pa are arranged in a pentile structure in the pixel group PG, but only one pixel group PG may be included in the basic unit U. The remaining area of the basic unit U may be provided as a transmission area TA. Therefore, the number of auxiliary sub-pixels Pa and the number of main sub-pixels Pm arranged per the same (e.g., substantially the same) area may be provided in a ratio of 1:4. In some embodiments, one pixel group PG may be surrounded by a transmission area TA.

FIGS. 7A and 7B show that a plurality of auxiliary sub-pixels Pa are arranged in a pentile matrix structure, but the disclosure is not limited thereto. For example, the plurality of auxiliary sub-pixels Pa may be arranged in various suitable shapes such as, for example, a stripe structure, a mosaic array structure, or a delta array structure.

In addition, although the size of the auxiliary sub-pixel Pa in FIGS. 7A and 7B is the same (e.g., substantially the same) as the size of the main sub-pixel Pm in FIG. 6, the disclosure is not limited thereto. The size of the auxiliary sub-pixel Pa may be provided larger than the size of the main sub-pixel Pm giving the same (e.g., substantially the same) color. For example, the size of a blue pixel Pb of the auxiliary sub-pixel Pa may be larger than that of a blue pixel Pb of the main sub-pixel Pm. The difference in size may be designed in consideration of differences in luminance and/or resolution between the component area CA and the main display area MDA.

Figure 8:
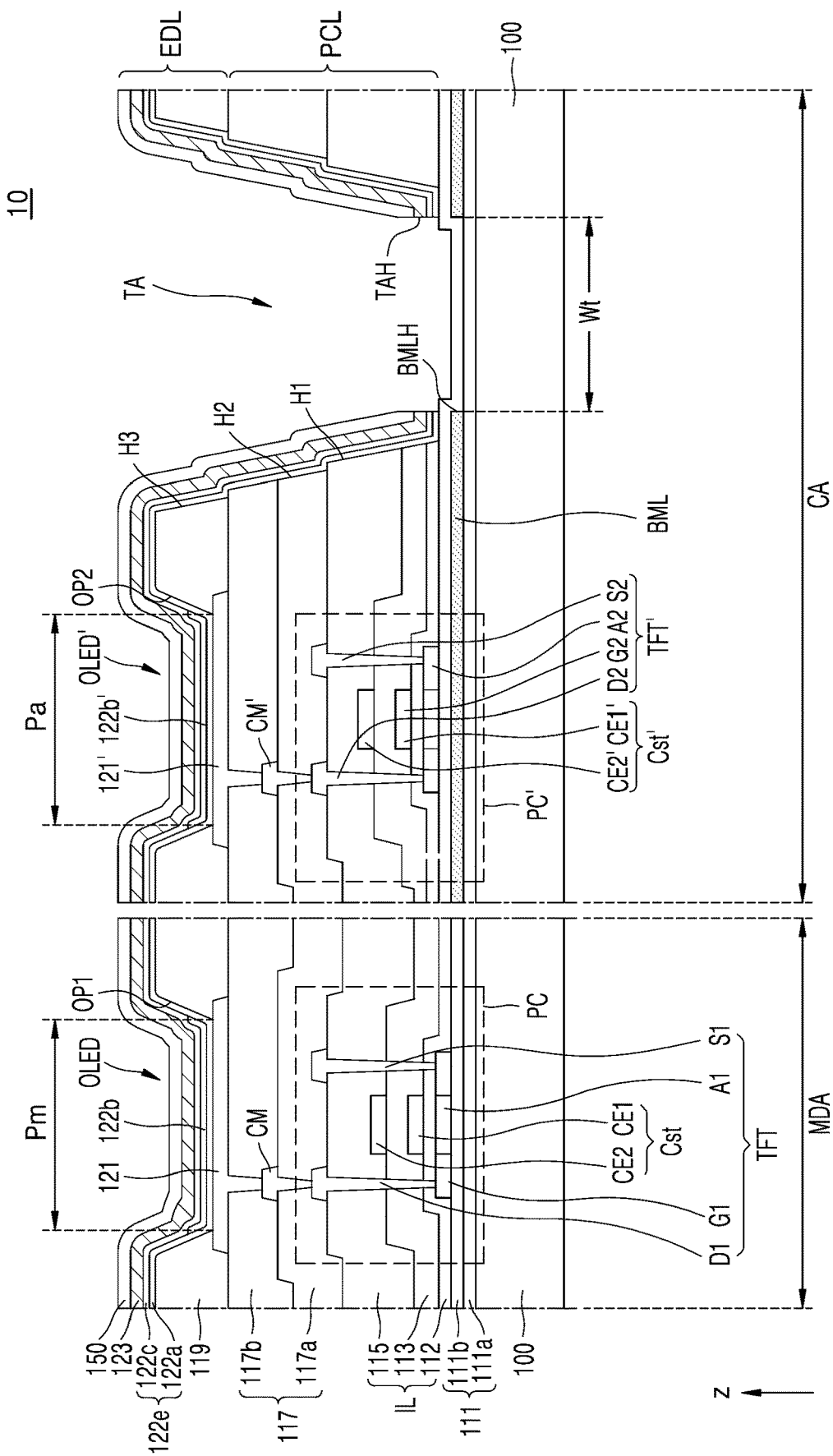
FIG. 8 shows a schematic cross-sectional view illustrating part of a display panel according to an embodiment, and a cross-sectional view schematically illustrating a main display area and a component area.

FIG. 8 is a schematic cross-sectional view showing a part of the display panel 10, according to an embodiment, and is a cross-sectional view schematically showing a main display area MDA and a component area CA.

Referring to FIG. 8, display panel 10 includes a main display area MDA and a component area CA. A main sub-pixel Pm is included in the main display area MDA, and the component area CA includes an auxiliary sub-pixel Pa and a transmission area TA. The main display area MDA includes a main pixel circuit PC including a main thin-film transistor TFT and a main storage capacitor Cst, and a main organic light-emitting diode OLED, which is a display element coupled to the main pixel circuit PC. The component area CA includes an auxiliary pixel circuit PC' including an auxiliary thin-film transistor TFT' and an auxiliary storage capacitor Cst', and an auxiliary organic light-emitting diode OLED', which is a display element coupled to the auxiliary pixel circuit PC'.

Although an organic light-emitting diode is used as a display element in this embodiment, for example, an inorganic light-emitting element and/or a quantum dot light-emitting element may be employed as a display element in embodiments of the disclosure.

Hereinafter, a structure in which the components included in the display panel 10 are stacked will be described. The display panel 10 may be provided by stacking the substrate 100, a buffer layer 111, the circuit layer PCL, the display element layer EDL, the sealing member ENCM, and the optical functional layer OFL.

As described above, the substrate 100 may include an insulating material such as glass, quartz, and/or polymer resin. The substrate 100 may be a rigid substrate or a flexible substrate capable of bending, folding, rolling, and/or the like.

The buffer layer 111 may be on the substrate 100 to reduce or block the penetration of foreign matter, moisture and/or outside air from the bottom of the substrate 100, and/or provide a flat surface on the substrate 100. The buffer layer 111 may include an inorganic material such as an oxide and/or nitride, and/or an organic material, and/or an organic-inorganic composite, and may include a single layer or multi-layer structure of the inorganic material and the organic material. Between the substrate 100 and the buffer layer 111 may further include a barrier layer to block or reduce the infiltration of outside air. In some embodiments, the buffer layer 111 may include silicon oxide ($SiO_2$) and/or silicon nitride ($SiN_X$). The buffer layer 111 may be provided such that a first buffer layer 111a and a second buffer layer 111b are stacked.

In the component area CA, the lower metal layer BML may be between the first buffer layer 111a and the second buffer layer 111b. In another embodiment, the lower metal layer BML may be between the substrate 100 and the first buffer layer 111a. The lower metal layer BML is under the auxiliary pixel circuit PC' so that the deterioration of the characteristics of the auxiliary thin-film transistor TFT' due to light emitted from a component, etc. may be prevented or reduced. In addition, the lower metal layer BML may prevent light emitted from a component and/or the like and directed to the component from diffracting through a narrow gap between wirings coupled to the auxiliary pixel circuit PC' (or may reduce such diffraction). The lower metal layer BML is not present in the transmission area TA.

A bias voltage may be applied to the lower metal layer BML. The lower metal layer BML may significantly reduce the probability of electrostatic discharge being generated when a bias voltage is provided. The Lower metal layer BML is aluminum (Al), platinum (Pt), palladium (Pd), silver (Ag), magnesium (Mg), gold (Au), nickel (Ni), neodymium (Nd), iridium (Ir), Chromium (Cr), calcium (Ca), molybdenum (Mo), titanium (Ti), tungsten (W), and/or copper (Cu). The lower metal layer BML may be provided as a single layer or multiple layers of the aforementioned materials.

The circuit layer PCL is on the buffer layer 111, and may include the pixel circuits PC and PC', a first gate-insulating layer 112, a second gate-insulating layer 113, an interlayer insulating layer 115, and/or a planarization layer 117. The main pixel circuit PC may include the main thin-film transistor TFT and the main storage capacitor Cst, and the auxiliary pixel circuit PC' may include the auxiliary thin-film transistor TFT' and the auxiliary storage capacitor Cst'.

The main thin-film transistor TFT and the auxiliary thin-film transistor TFT' may be on the buffer layer 111. The main thin-film transistor TFT includes the first semiconductor layer A1, the first gate electrode G1, the first source electrode S1, and the first drain electrode D1, and the auxiliary thin-film transistor TFT' includes the second semiconductor layer A2, the second gate electrode G2, the second source electrode S2, and the second drain electrode D2. The main thin-film transistor TFT may be coupled to the main organic light emitting diode OLED to drive the main organic light emitting diode OLED. The auxiliary thin-film transistor TFT' may be coupled to the auxiliary organic light emitting diode OLED' to drive the auxiliary organic light emitting diode OLED'.

The first semiconductor layer A1 and the second semiconductor layer A2 are on the buffer layer 111 and may include polysilicon. In another embodiment, the first semiconductor layer A1 and the second semiconductor layer A2 may include amorphous silicon. In another embodiment, the first semiconductor layer A1 and the second semiconductor layer A2 may include oxide of at least one material selected from the group containing indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 and the second semiconductor layer A2 may include a channel area, and a source area and drain area doped with impurities.

The second semiconductor layer A2 may overlap the lower metal layer BML with the second buffer layer 111b therebetween. As an embodiment, the width of the second semiconductor layer A2 may be formed smaller than the width of the lower metal layer BML, so when projected in a direction perpendicular (e.g., substantially perpendicular) to the substrate 100, the second semiconductor layer A2 may overlap the lower metal layer BML as a whole.

The first gate-insulating layer 112 may be provided to cover the first semiconductor layer A1 and the second semiconductor layer A2. The first gate-insulating layer 112 may include inorganic insulating materials such as silicon oxide (SiO2), silicon nitride (SiNX), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The first gate-insulating layer 112 may be a single layer or multiple layers including the above-described inorganic insulating materials.

The first gate electrode G1 and the second gate electrode G2 are on the first gate-insulating layer 112 to overlap the first semiconductor layer A1 and the second semiconductor layer A2, respectively. The first gate electrode G1 and the second gate electrode G2 include molybdenum (Mo), aluminum (Al), copper (Cu), titanium (Ti), etc., and may be formed in a single layer or multiple layers. For example, the first gate electrode G1 and the second gate electrode G2 may be a single layer of Mo.

The second gate-insulating layer 113 may cover the first gate electrode G1 and the second gate electrode G2. The second gate-insulating layer 113 may include inorganic insulating materials such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The second gate-insulating layer 113 may be a single layer or multiple layers including the above-described inorganic insulating materials.

The second gate-insulating layer 113 may include a first upper electrode CE2 of the main storage capacitor Cst and a second upper electrode CE2' of the auxiliary storage capacitor Cst'.

In the main display area MDA, the first upper electrode CE2 may overlap the first gate electrode G1 below the first upper electrode CE2. The first gate electrode G1 and the first upper electrode CE2 overlapping each other with the second gate-insulating layer 113 therebetween may form the main storage capacitor Cst. The first gate electrode G1 may be a first lower electrode CE1 of the main storage capacitor Cst.

In the component area CA, the second upper electrode CE2' may overlap the second gate electrode G2 below the second upper electrode CE2'. The second gate electrode G2 and the second upper electrode CE2' overlapping each other with the second gate-insulating layer 113 therebetween may form the auxiliary storage capacitor Cst'. The first gate electrode G1 may be a second lower electrode CE1' of the auxiliary storage capacitor Cst'.

The first upper electrode CE2 and the second upper electrode CE2' may include aluminum (Al), platinum (Pt), palladium (Pd), silver (Ag), magnesium (Mg), gold (Au), nickel (Ni), neodymium (Nd), Iridium (Ir), chromium (Cr), calcium (Ca), molybdenum (Mo), titanium (Ti), tungsten (W), and/or copper (Cu), and may be a single layer or multiple layers of the aforementioned materials.

The interlayer insulating layer 115 may cover the first upper electrode CE2 and the second upper electrode CE2'. The interlayer insulating layer 115 may include silicon oxide (SiO2), silicon nitride (SiNX), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxides ($ZnO_2$). The interlayer insulating layer 115 may be a single layer or multi-layer including the above-described inorganic insulating materials.

When the first gate-insulating layer 112, the second gate-insulating layer 113, and the interlayer insulating layer 115 are collectively referred to as an inorganic insulating layer IL, the inorganic insulating layer IL may include a first hole H1 corresponding to the transmission area TA. The first hole H1 may expose a portion of the upper surface of the buffer layer 111 or the substrate 100. The first hole H1 may be formed by overlapping an opening of the first gate-insulating layer 112, an opening of the second gate-insulating layer 113, and an opening of the interlayer insulating layer 115 corresponding to the transmission area TA. These openings may be respectively formed through separate processes or may be formed concurrently (e.g., simultaneously) through the same (e.g., substantially the same) process. When these openings are formed in a separate process, an inner surface of the first hole H1 may not be smooth and may include a step-like step.

Of course, unlike this, the inorganic insulating layer IL may include a groove other than the first hole H1 exposing the buffer layer 111. In some embodiments, the inorganic insulating layer IL may not include a first hole H1 or groove corresponding to the transmission area TA. The inorganic insulating layer IL generally includes an inorganic insulating material of excellent light transmittance, and thus has suitable or sufficient transmittance even if it does not include holes or grooves corresponding to the transmission area TA, so that the component 40 (see FIG. 2) transmits/receives suitable or sufficient light.

The source electrodes S1 and S2 and the drain electrodes D1 and D2 may be on the interlayer insulating layer 115. The source electrodes S1 and S2 and the drain electrodes D1 and D2 may include a conductive material including molybdenum (Mo), aluminum (Al), copper (Cu), titanium (Ti), and/or the like, and may be a multi-layer or a single layer including the aforementioned materials. For example, the source electrodes S1 and S2 and the drain electrodes D1 and D2 may be a multi-layer structure of Ti/Al/Ti.

The planarization layer 117 may cover the source electrodes S1 and S2 and the drain electrodes D1 and D2. The planarization layer 117 may include a flat upper surface so that a first pixel electrode 121 and a second pixel electrode 121' thereon may be formed flat.

The planarization layer 117 may include an organic material and/or an inorganic material, and may be a single-layer structure or a multi-layer structure. The planarization layer 117 may include a first planarization layer 117a and a second planarization layer 117b. Accordingly, a conductive pattern such as wiring may be formed between the first planarization layer 117a and the second planarization layer 117b, which may be beneficial for high integration.

The planarization layer 117 may include a general-purpose polymer such as benzocyclobutene (BCB), polyimide, hexamethyldisiloxane (HMDSO), polymethylmethacrylate (PMMA), and/or polystyrene (PS), a polymer derivative including a phenolic group, an acrylic polymer, imide polymers, aryl ether polymers, amide polymers, fluorine polymers, p-xylene polymers, and/or vinyl alcohol polymers. In some embodiments, the planarization layer 117 may include inorganic insulating materials such as silicon oxide (SiO2), silicon nitride (SiNX), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). When forming the planarization layer 117, chemical mechanical polishing may be performed on the upper surface of the layer to provide a flat upper surface after forming the layer.

The first planarization layer 117a may cover the pixel circuits PC and PC'. The second planarization layer 117b is on the first planarization layer 117a, and may include a flat upper surface so that the pixel electrodes 121 and 121' may be formed flat.

The organic light-emitting diodes OLED and OLED' are on the second planarization layer 117b. The pixel electrodes 121 and 121' of the organic light emitting diodes OLED and OLED' may be coupled to the pixel circuits PC and PC' through connection electrodes CM and CM' on the planarization layer 117.

The connection electrodes CM and CM' may be between the first planarization layer 117a and the second planarization layer 117b. The connection electrode CM and CM' may include a conductive material including molybdenum (Mo), aluminum (Al), copper (Cu), titanium (Ti), etc., and may be a multi-layer or single layer including the above materials. For example, the connection electrodes CM and CM' may be formed of a multi-layer structure of Ti/Al/Ti.

The planarization layer 117 may include a second hole H2 corresponding to the transmission area TA. The second hole H2 may overlap the first hole H1. In FIG. 8, the second hole H2 is shown to be formed larger than the first hole H1. In another embodiment, the planarization layer 117 covers the edge of the first hole H1 of the inorganic insulating layer IL, so that the area of the second hole H2 may be formed to be smaller than the area of the first hole H1.

The planarization layer 117 includes a via hole exposing either the first source electrode S1 or first drain electrode D1 of the main thin-film transistor TFT, and the first pixel electrode 121 may be electrically coupled to the main thin-film transistor TFT by contacting (e.g., physically contacting) the first source electrode S1 or the first drain electrode D1 through this via hole. In addition, the planarization layer 117 includes a via hole exposing one selected from the second source electrode S2 and second drain electrode D2 of the auxiliary thin-film transistor TFT', and the second pixel electrode 121' may be electrically coupled to the auxiliary thin-film transistor TFT' by contacting (e.g., physically contacting) the second source electrode S2 or the second drain electrode D2 through this via hole.

The first pixel electrode 121 and the second pixel electrode 121' may include conductive oxides such as indium tin oxide (ITO), indium zinc oxide (IZO), zinc oxide (ZnO), indium oxide ($In_2O_3$), indium gallium oxide (IGO), and/or aluminum zinc oxide (AZO). The first pixel electrode 121 and the second pixel electrode 121' may include a reflective film including silver (Ag), magnesium (Mg), aluminum (Al), platinum (Pt), palladium (Pd), gold (Au), nickel (Ni), and neodymium (Nd), Iridium (Ir), chromium (Cr), and/or compounds thereof. For example, the first pixel electrode 121 and the second pixel electrode 121' may include a structure including films including ITO, IZO, ZnO, and/or $In_2O_3$ above and below the above-described reflective film. In some embodiments, the first pixel electrode 121 and the second pixel electrode 121' may include a stacked structure of ITO/Ag/ITO.

A pixel-defining layer 119 may cover each of edges of the first pixel electrode 121 and the second pixel electrode 121', on the planarization layer 117, and may include a first opening OP1 and a second opening OP2 respectively exposing central portions of the first pixel electrode 121 and second pixel electrode 121'. The first opening OP1 and the second opening OP2 define the size and shape of the emitting area of the organic light-emitting diodes OLED and OLED', for example, the sub-pixels Pm and Pa.

The pixel-defining layer 119 increases a distance between the edges of the pixel electrodes 121 and 121' and the counter electrode 123 above the pixel electrodes 121 and 121', thereby preventing or reducing occurrence of arcs and/or the like in the edges of the pixel electrodes 121 and 121'. The pixel-defining layer 119 is an organic insulating material such as polyimide, polyamide, acrylic resin, benzocyclobutene, hexamethyldisiloxane (HMDSO), and/or phenol resin, and may be formed by a method such as spin coating.

The pixel-defining layer 119 may include a third hole H3 in the transmission area TA. The third hole H3 may overlap the first hole H1 and the second hole H2. By the first hole H1 to the third hole H3, light transmittance in the transmission area TA may be improved. In some embodiments, in FIG. 7, the buffer layer 111 is shown to be continuously arranged in correspondence with the transmission area TA, but it is that the buffer layer 111 may include a hole in the transmission area TA. A portion of the counter electrode 123, which will be further described herein below, may be on inner surfaces of the first hole H1 to the third hole H3.

Inside the first opening OP1 and the second opening OP2 of the pixel-defining layer 119, a first emission layer 122b and a second emission layer 122b' formed to correspond to the first pixel electrode 121 and the second pixel electrode 121', respectively, are located. The first emission layer 122b and the second emission layer 122b' may include a high molecular-weight material and/or a low molecular-weight material, and may emit red, green, blue, or white light.

An organic functional layer 122e may be above and/or below the first emission layer 122b and the second emission layer 122b'. The organic functional layer 122e may include a first functional layer 122a and/or a second functional layer 122c. The first functional layer 122a or the second functional layer 122c may be omitted.

The first functional layer 122a may be under the first emission layer 122b and the second emission layer 122b'. The first functional layer 122a may be a single layer or multiple layers including organic materials. The first functional layer 122a may be a hole transport layer (HTL) of a single layer structure. In some embodiments, the first functional layer 122a may include a hole injection layer (HIL) and a hole transport layer (HTL). The first functional layer 122a may be integrally formed to correspond to organic light emitting diodes OLED and OLED' respectively included in the main display area MDA and the component area CA.

The second functional layer 122c may be on the first emission layer 122b and the second emission layer 122b'. The second functional layer 122c may be a single layer or multiple layers including organic materials. The second functional layer 122c may include an electron transport layer (ETL) and/or an electron injection layer (EIL). The second functional layer 122c may be integrally formed to correspond to organic light emitting diodes OLED and OLED' respectively included in the main display area MDA and the component area CA.

The counter electrode 123 is on the second functional layer 122c. The counter electrode 123 may include a conductive material of a low work function. For example, the counter electrode 123 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and/or an alloy thereof. In some embodiments, the counter electrode 123 may further include a layer such as ITO, IZO, ZnO, and/or $In_2O_3$ on a (semi)transparent layer containing the aforementioned material. The counter electrode 123 may be integrally formed to correspond to organic light emitting diodes OLED and OLED' respectively included in the main display area MDA and the component area CA.

The layers from the first pixel electrode 121 to the counter electrode 123 formed in the main display area MDA may form the main organic light-emitting diode OLED. The layers from the second pixel electrode 121' to the counter electrode 123 formed in the component area CA may form the auxiliary organic light emitting diode OLED'.

An upper layer 150 including an organic material may be formed on the counter electrode 123. The upper layer 150 may be a layer provided to protect the counter electrode 123 and increase light extraction efficiency. The upper layer 150 may include an organic material of a higher refractive index than the counter electrode 123.

In some embodiments, the upper layer 150 may be provided by stacking layers of different refractive indices. For example, the upper layer 150 may be provided by stacking a high refractive-index layer/low refractive-index layer/high refractive-index layer. In some embodiments, the refractive index of the high refractive index layer may be 1.7 or more, and the refractive index of the low refractive index layer may be 1.3 or less.

The upper layer 150 may further include LiF. In some embodiments, the upper layer 150 may further include an inorganic insulating material such as silicon oxide ($SiO_2$) and/or silicon nitride ($SiN_x$).

The first functional layer 122a, the second functional layer 122c, the counter electrode 123, and the upper layer 150 may include a transmission hole TAH corresponding to the transmission area TA. For example, each of the first functional layer 122a, the second functional layer 122c, the counter electrode 123, and the upper layer 150 may include an opening corresponding to the transmission area TA. The areas of such openings may be substantially the same. For example, an area of an opening of the counter electrode 123 may be substantially the same as the area of the transmission hole TAH.

It may be understood that the transmission hole TAH as corresponding to the transmission area TA means that the transmission hole TAH overlaps the transmission area TA. At this time, an area of the transmission hole TAH may be provided narrower than an area of the first hole H1 formed in the inorganic insulating layer IL. To this end, FIG. 8 shows that the width Wt of the transmission hole TAH is smaller than the width of the first hole H1. Here, the area of the transmission hole TAH may be defined as the area of the opening having the smallest area among the openings constituting the transmission hole TAH. The area of the first hole H1 may also be defined as the area of an opening having the smallest area among the openings constituting the first hole H1.

Due to the transmission hole TAH, a part of the counter electrode 123 does not exist in the transmission area TA, and through this, the light transmittance in the transmission area TA may be significantly increased. The counter electrode 123 equipped with such a transmission hole TAH may be formed by various suitable methods. In an embodiment, after forming the material forming the counter electrode 123 on the front surface of the substrate 100, the portion corresponding to the transmission area TA is removed through laser lift off, and the counter electrode 123 including a transmission hole TAH may be thereby formed. In another embodiment, the counter electrode 123 including the transmission hole TAH may be formed through a metal self-patterning (MSP) method. In another embodiment, the counter electrode 123 including the transmission hole TAH may be formed by depositing the counter electrode 123 using a fine metal mask (FMM).

The lower metal layer BML of the component area CA may correspond to the entire component area CA. In some embodiments, the lower metal layer BML may include a lower-hole (BMLH) overlapping the transmission area TA. In some embodiments, the shape and size of the transmission area TA may be defined by the shape and size of the lower-hole (BMLH).

Figure 9:
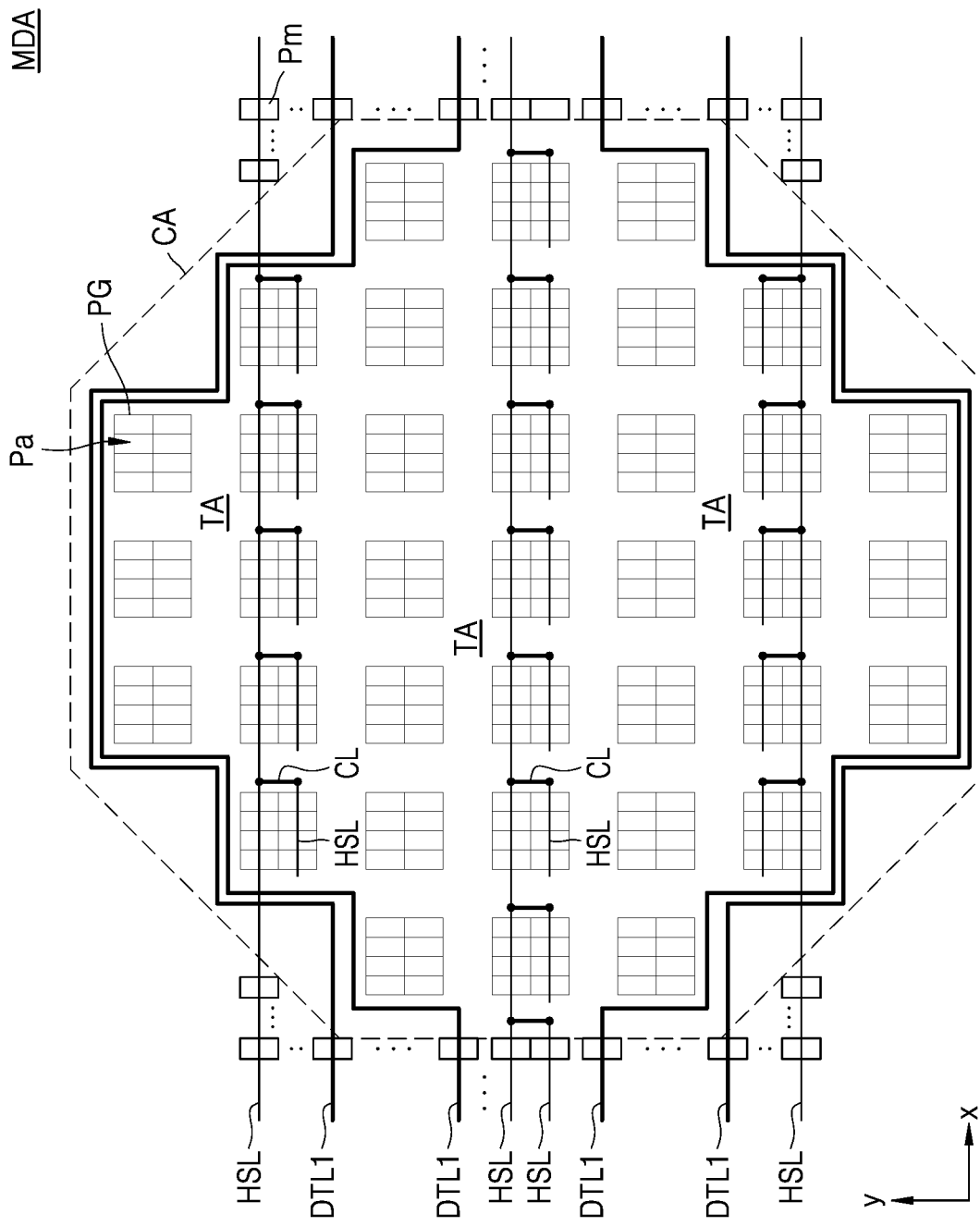
FIG. 9 is a plan view schematically illustrating an arrangement relationship of sub-pixels and some wirings of a display panel, according to an embodiment.

FIG. 9 is a plan view of the main display area schematically showing an arrangement relation of sub-pixels and some wirings of a display panel, according to an embodiment. This plan view shows only a portion of the display panel, and additional sub-pixels are omitted. In addition, because this plan view shows only the wirings necessary for explanation, additional wirings are omitted. This plan view shows the component area CA and part of the main display area MDA outside the component area CA.

Referring to FIG. 9, the plurality of pixel groups PG spaced apart from each other are in the component area CA, and the transmission area TA is between the plurality of pixel groups PG. A preset number of auxiliary sub-pixels Pa may be in each of the plurality of pixel groups PG.

In this embodiment, first bypass wirings DTL1 and horizontal wirings HSL extend in the x direction.

The first bypass wirings DTL1 extends in the x direction to electrically couple the pixel circuit of the main sub-pixel Pm in the same row in the main display area MDA, but may be bent to be bypassed along the outermost edge of the component area CA without being coupled to the pixel circuit of the auxiliary sub-pixel Pa. Some of the first bypass wirings DTL1 may be bypassed along the upper side (+y direction) of the component area CA, and some of them may be bypassed along the lower side (−y direction) of the component area CA.

The first bypass wirings DTL1 may be bent along one side of the pixel group PG at the outermost edge of the pixel groups PG in the component area CA. In some embodiments, on a plane, the first bypass wiring DTL1 may be bent in a step shape or a zigzag shape.

Figure 10:
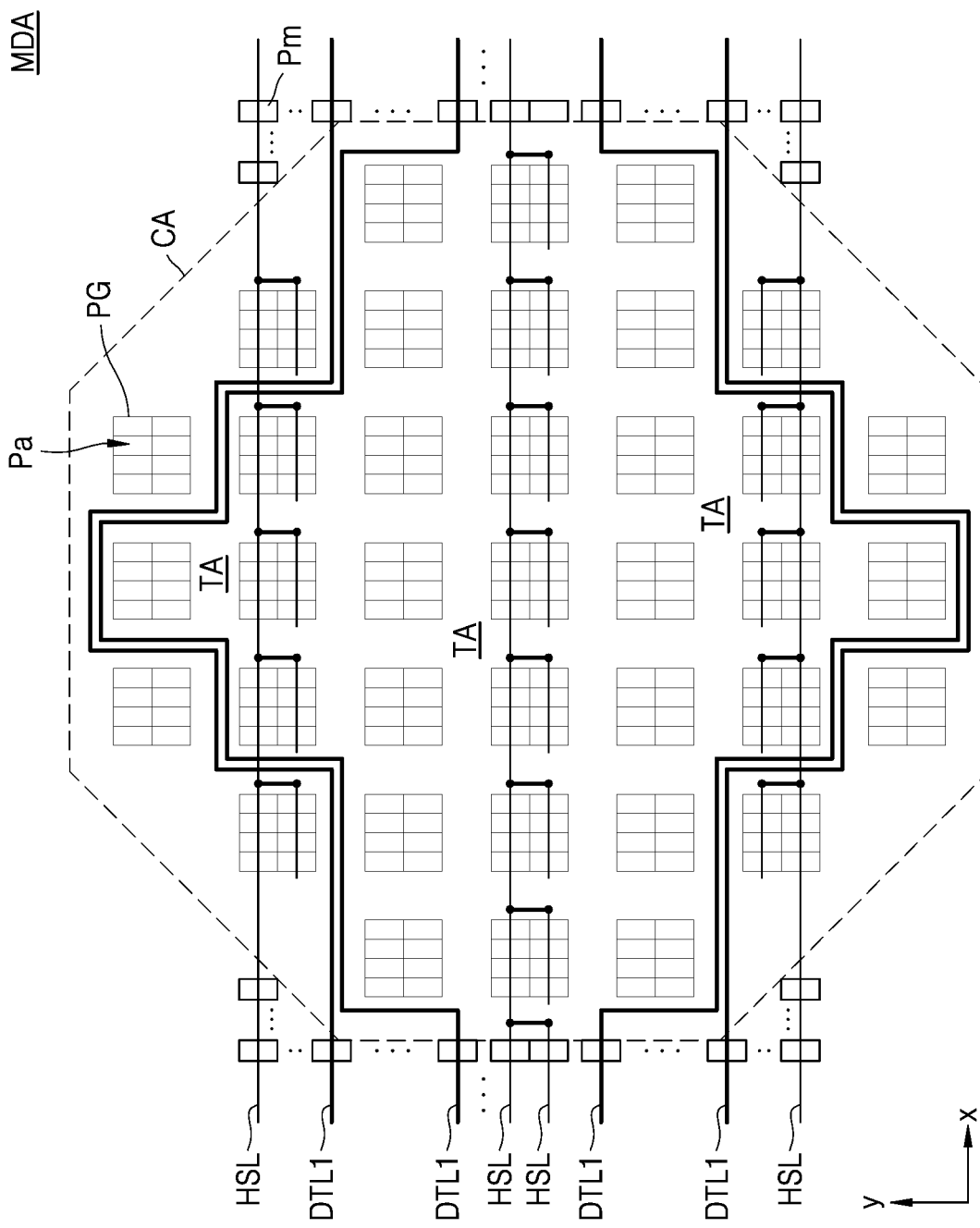
FIG. 10 is a plan view schematically illustrating an arrangement relationship of sub-pixels and some wirings of a display panel, according to an embodiment.

FIG. 9 illustrates that the first bypass wirings DTL1 are bent along the outside of the pixel group PG at the outermost edge of the component area CA, for example, between the component area CA and the main display area MDA, but the disclosure is not limited thereto. As illustrated in FIG. 10, first bypass wirings DTL1 may be bent along the inside of the pixel group PG at the outermost edge of the component area CA.

As such, wirings not coupled to the pixel circuit of the auxiliary sub-pixel Pa bypass along the periphery of the component area CA without crossing the transmission area TA, so that a high aperture ratio of the transmission area TA may be secured.

The horizontal wirings HSL extend in the x direction, and may electrically couple the pixel circuit of the main sub-pixel Pm and the pixel circuit of the auxiliary sub-pixel Pa. The horizontal wirings HSL may be on a different layer from the bypass wiring DTL1 in at least some areas.

In some embodiments, some of the horizontal wirings HSL in the plurality of pixel groups PG of the component area CA may be coupled to each other through a connection line CL. Accordingly, the number of wires extending in the x-direction among the plurality of pixel groups PG is reduced, so that the transmittance of the transmission area TA may be secured. The connection line CL is on a different layer from the horizontal wirings HSL, and may be coupled to the horizontal wirings HSL through a contact hole.

Hereinafter, a connection relationship of the horizontal wirings HSL in the plurality of pixel groups PG will be further described with reference to FIG. 11.

Figure 11:
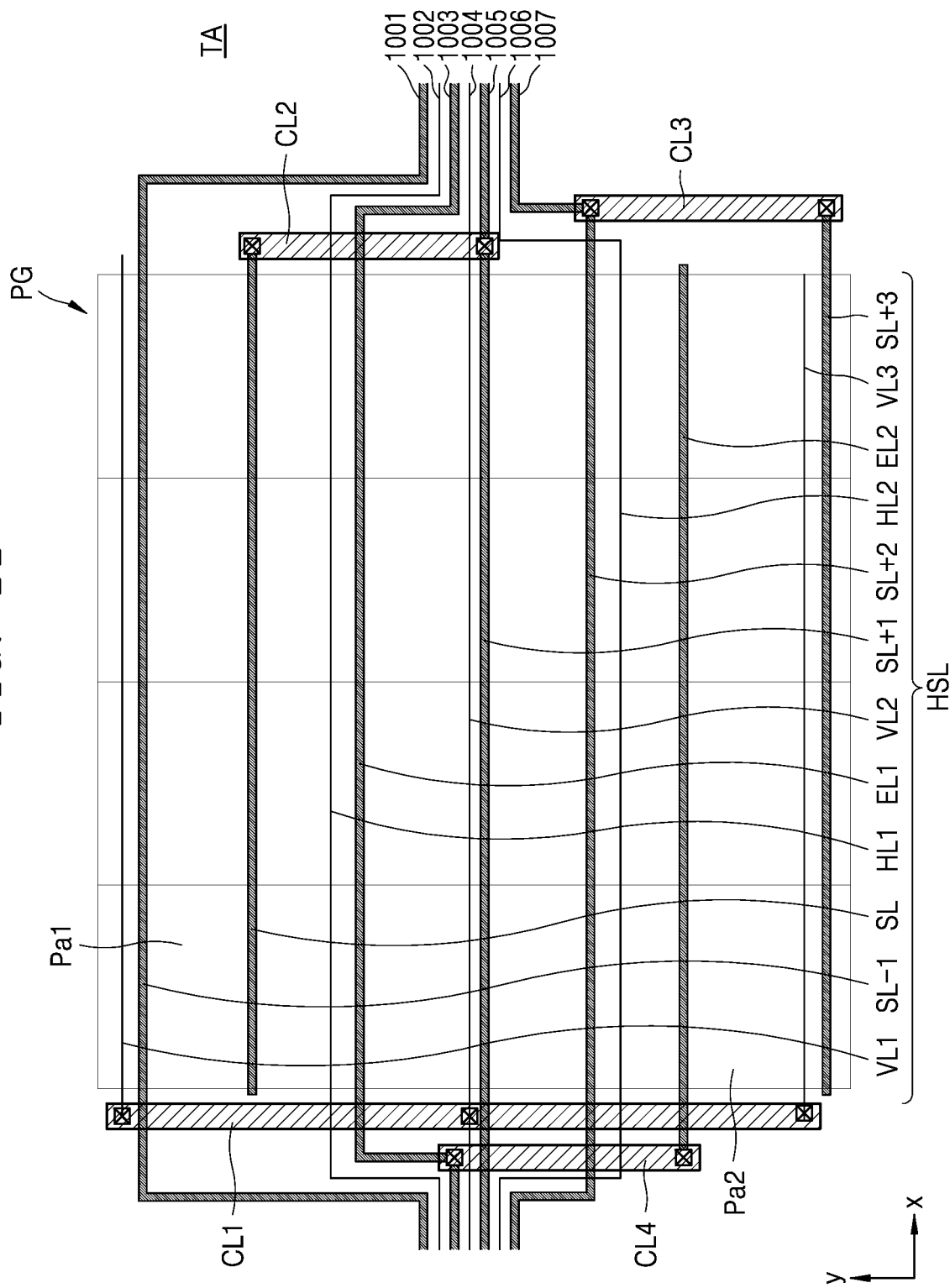
FIG. 11 is a plan view schematically illustrating an arrangement relationship of wirings coupled to one pixel group, according to an embodiment.

FIG. 11 is a layout diagram schematically showing wirings in one pixel group of a component area.

Referring to FIG. 11, a pixel group PG may be surrounded by a transmission area TA. In an embodiment, eight auxiliary sub-pixels Pa may be in one pixel group PG, and the eight auxiliary sub-pixels Pa may be arranged in a pentile structure described with reference to FIGS. 7A and 7B.

When the auxiliary sub-pixels Pa are arranged in a pentile type (e.g., in a pentile arrangement), the first initialization voltage line VL1, the first scan line SL−1, the second scan line SL, a first electrode voltage line HL1, a first emission-control line EL1, the second initialization voltage line VL2, and the third scan line SL+1 may be electrically coupled to a pixel circuit of a first auxiliary sub-pixel Pa1 while traversing the first auxiliary sub-pixel Pa1 included in the first row in the first direction (x).

In addition, the second initialization voltage line VL2, the third scan line SL+1, a fourth scan line SL+2, a second electrode voltage line HL2, a second emission-control line EL2, a third initialization voltage line VL3, and a fifth scan line SL+3 may be electrically coupled to a pixel circuit of a second auxiliary sub-pixel Pa2 while crossing the pixel circuit of the second auxiliary sub-pixel Pa2 in the first direction (x). In some embodiments, the second auxiliary sub-pixel Pa2 may be adjacent to the first auxiliary sub-pixel Pa1 in a second direction (y).

In some embodiments, the second initialization voltage line VL2 and the third scan line SL+1 may be shared by the first auxiliary sub-pixel Pa1 and the second auxiliary sub-pixel Pa2.

Therefore, the second initialization voltage line VL2 may be electrically coupled to a second initialization thin-film transistor of the first auxiliary sub-pixel Pa1 (see T7 in FIG. 4) and a first initialization thin-film transistor of the second auxiliary sub-pixel Pa2 (see T4 in FIG. 4). In addition, the third scan line SL+1 is electrically coupled to the first initialization thin-film transistor of the second auxiliary sub-pixel Pa2 (see T4 in FIG. 4), and a scan signal applied to the third scan line SL+1 may be transferred as a previous scan signal to the first initialization thin-film transistor (T4 in FIG. 4) of the second auxiliary sub-pixel Pa2.

In some embodiments, in FIG. 11, the horizontal wirings HSL extending in the first direction (x) and traversing one pixel group PG may include 12 lines, including the first initialization voltage line VL1, the first scan line SL−1, the second scan line SL, the first electrode voltage line HL1, the first emission-control line EL1, the second initialization voltage line VL2, the third scan line SL+1, the fourth scan line SL+2, the second electrode voltage line HL2, the second emission-control line EL2, the third initialization voltage line VL3, and the fifth scan line SL+3.

The horizontal wirings HSL included in each of the pixel groups PG are electrically coupled by extension wirings 1001 to 1007 extending in the first direction (x) in the transmission area TA, and the number of extension wirings 1001 to 1007 may be less than the number of horizontal wirings HSL, and the extension wirings 1001, 1002, 1003, 1004, and 1005 may be integrally provided with some of the horizontal wirings.

As an example, among the horizontal wirings HSL, the first initialization voltage line VL1 and the second initialization voltage line VL2 described above may be electrically coupled to the third initialization voltage line VL3 that crosses a second row in the first direction (x) by a first connection line CL1. The third initialization voltage line VL3 may apply an initialization voltage to a second initialization thin-film transistor (see T7 in FIG. 9) of the second auxiliary sub-pixel Pa2. In some embodiments, as an example, only the second initialization voltage line VL2 among the first initialization voltage line VL1, the second initialization voltage line VL2, and the third initialization voltage line VL3 may be extended to the transmission area TA to form the fourth extension wiring 1004.

In addition, the second scan line SL and the third scan line SL+1 may be coupled by a second connection line CL2 to receive the same scan signal, and only the third scan line SL+1 may be extended to the transmission area TA to form the fifth extension wiring 1005.

In addition, the fourth scan line SL+2 and fifth scan line SL+3 traversing the second row in the first direction (x) may be coupled by a third connection line CL3, and only the fourth scan line SL+2 may be extended to the transmission area TA to form the seventh extension wiring 1007.

In addition, the first emission-control line EL1 crossing the first row in the first direction (x) and the second emission-control line EL2 crossing the second row in the first direction (x) may be coupled by a fourth connection line CL4, and may be electrically coupled to the third extension wiring 1003. Accordingly, the same emission-control signal may be transmitted to the first auxiliary sub-pixel Pa1 and the second auxiliary sub-pixel Pa2. In some embodiments, the third extension wiring 1003 may be formed by extending the first emission-control line EL1, or may be configured as a separate wiring on a different layer from the first emission-control line EL1.

The first connection line CL1, the second connection line CL2, the third connection line CL3, and the fourth connection line CL4 described above may be on different layers from the horizontal wirings HSL. For example, the first connection line CL1, the second connection line CL2, the third connection line CL3, and the fourth connection line CL4 may be on the interlayer insulating layer 115.

In some embodiments, the first extension wiring 1001 may be integrally formed with the first scan line SL−1, the second extension wiring 1002 may be integrally provided with the first electrode voltage line HL1, and the sixth extension wiring 1006 may be integrally formed with the second electrode voltage line HL2.

Therefore, because 12 horizontal wirings HSL crossing one pixel group PG are coupled to the 7 extension wirings 1001 to 1007, the number of wires in the transmission area TA is reduced, so that the transmittance of the transmission area TA may be improved. Also, the extension wirings 1001 to 1007 may be adjacent to each other in the central portion of the pixel group PG. For example, on a plane, the width of an area in which the extension wirings 1001 to 1007 are arranged along the second direction (y) is smaller than the width of an area in which the second horizontal wirings HSL are arranged along the second direction (y). As a result, interference caused by the extension wirings 1001 to 1007 may be reduced when the component (see 40 in FIG. 2) transmits and receives signals as compared to the case where the extension wirings 1001 to 1007 are widely distributed in the transmission area TA.

Figure 12:
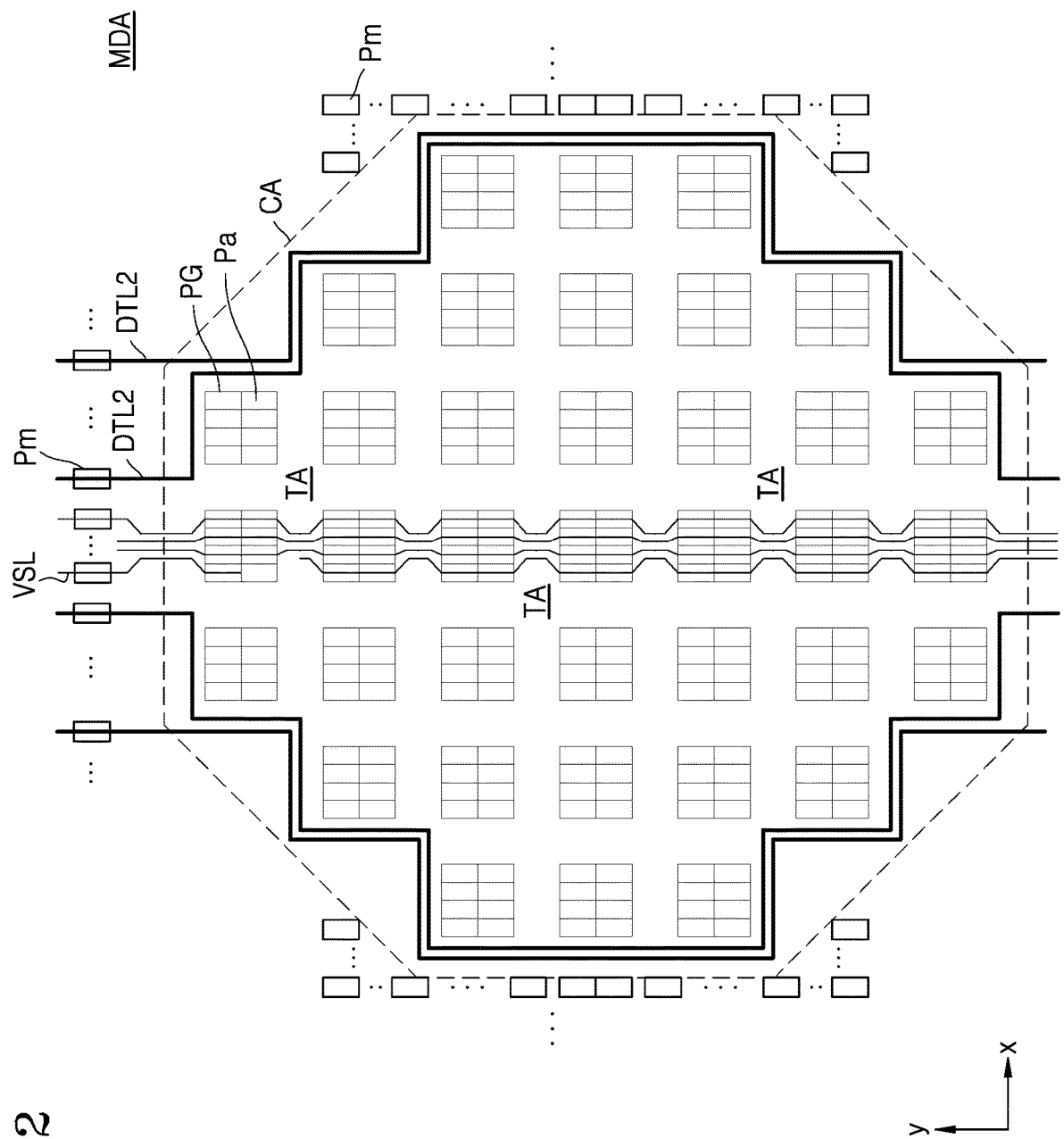
FIG. 12 is a plan view of a main display area schematically illustrating an arrangement relationship of sub-pixels and some wirings of a display panel, according to an embodiment.

FIG. 12 is a plan view of the main display area schematically showing the arrangement relationship of sub-pixels and some wirings of the display panel, according to an embodiment. This plan view shows only a portion of the display panel, so more sub-pixels are omitted. In addition, because this plan view shows only the wirings necessary for explanation, more wirings are omitted. This plan view shows the component area CA and part of the main display area MDA outside the component area CA.

Referring to FIG. 12, the plurality of pixel groups PG spaced apart from each other are in the component area CA, and the transmission area TA is between the plurality of pixel groups PG. A preset number of auxiliary sub-pixels Pa may be in each of the plurality of pixel groups PG.

In this embodiment, second bypass wirings DTL2 and vertical wirings VSL extend in the y direction.

The second bypass wirings DTL2 extends in the y direction to electrically couple the pixel circuit of the main sub-pixel Pm in the same row in the main display area MDA, but may be bent to be bypassed along the outermost edge of the component area CA without being coupled to the pixel circuit of the auxiliary sub-pixel Pa. Some of the second bypass wirings DTL2 may be bypassed along the left side of the component area CA, while others may be bypassed along the right side of the component area CA.

The second bypass wirings DTL2 may be bent along one side of the pixel group PG at the outermost edge of the pixel groups PG in the component area CA. In some embodiments, the second bypass wiring DTL2 may be bent in a planar step shape or a zigzag shape.

In FIG. 12, the second bypass wirings DTL2 are shown to be bent along the outside of the pixel group PG at the outermost edge of the component area CA, for example, between the component area CA and the main display area MDA, but the disclosure is not limited thereto. The second bypass wirings DTL2 may be bent along the inside of the pixel group PG at the outermost edge of the component area CA.

As such, wirings not coupled to the pixel circuit of the auxiliary sub-pixel Pa bypass along the periphery of the component area CA without crossing the transmission area TA, so that a high aperture ratio of the transmission area TA may be secured.

The vertical wirings VSL extend in the y direction, and may electrically couple the pixel circuit of the main sub-pixel Pm and the pixel circuit of the auxiliary sub-pixel Pa. The vertical wirings VSL may be on a different layer from the second bypass wiring DTL2 in at least some areas. The second bypass wiring DTL2 and the vertical wiring VSL may be data lines transmitting data signals.

The spacing between vertical wirings VSL between the plurality of pixel groups PG may be smaller than the spacing between vertical wirings VSL in the pixel group PG.

According to such a wiring arrangement structure, the light transmittance of the transmission area TA and the light transmittance of the entire component area CA may be improved. On the other hand, as the distance between the wirings in the component area CA becomes narrow, a diffraction phenomenon of light may occur, so that the lower metal layer BML may overlap wirings in the component area CA.

As described above, the display panel and the display apparatus according to embodiments of the present disclosure adopt a structure that reduces the number of wires passing between the pixel groups in the component area, so that the transmittance may be improved by securing or achieving a wider transmittance area.

Of course, the scope of the disclosure is not limited by these effects.

It is to be understood that embodiments described herein are to be considered in a descriptive sense only and not for purposes of limitation. Descriptions of characteristics or aspects within each embodiment are to be considered as available for other similar characteristics or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. A display panel comprising:
a substrate comprising a first display area, and a second display area including pixel groups and a transmission area;
first display elements on the first display area, and first pixel circuits respectively coupled to the first display elements;
second display elements on the second display area and corresponding respectively to the pixel groups, and second pixel circuits respectively coupled to the second display elements, each of the second display elements comprise a pixel electrode, a emission layer, and a counter electrode; and
a lower metal layer in the second display area, and between the substrate and the second pixel circuits,
wherein the counter electrode has a transmission hole corresponding to the transmission area, and the lower metal layer has a lower-hole corresponding to the transmission area, and the transmission hole overlaps the lower-hole in a plan view.

2. The display panel of claim 1, wherein an entire area of the lower-hole is smaller than an entire area of the transmission hole.

3. The display panel of claim 1, wherein the lower metal layer is disposed to correspond to the entire second display area except the lower-hole corresponding to the transmission area.

4. The display panel of claim 1, further comprising an inorganic insulating layer disposed on the substrate, wherein the inorganic insulating layer has a first hole or a groove corresponding to the transmission area.

5. The display panel of claim 4, wherein the first hole or the groove overlaps the lower-hole.

6. The display panel of claim 1, further comprising:
first bypass wirings electrically coupling the first pixel circuits in a first direction, and bypassing along one side of one of the pixel groups at an outermost portion of a second display area; and
horizontal wirings electrically coupled to the first pixel circuits and the second pixel circuits and extending in the first direction.

7. The display panel of claim 6, further comprising:
extension wirings between two pixel groups adjacent to each other along the first direction, and extending in the first direction,
wherein the extension wirings are electrically coupled to the horizontal wirings included in each of the two pixel groups, and the number of the extension wirings is less than the number of the horizontal wirings.

8. The display panel of claim 6, wherein the first bypass wirings are bent in a staircase shape along a periphery of the pixel groups at an outermost portion of the second display area.

9. The display panel of claim 6, wherein the first bypass wirings are bent in a staircase shape along an inside of the pixel groups at an outermost portion of the second display area.

10. The display panel of claim 6, further comprising second bypass wires that electrically couple the first pixel circuits in a second direction that intersects the first direction, and that bypass along one side of a pixel group at an outermost portion of the second display area.

11. The display panel of claim 10, wherein the second bypass wires are bent in a staircase shape.

12. A display apparatus comprising:
a display panel comprising a first display area comprising first sub-pixels, and a second display area comprising a plurality of pixel groups and a transmission area; and
a component under the display panel to correspond to the second display area, wherein the display panel comprises:
a substrate;
first display elements on the first display area, and first pixel circuits respectively coupled to the first display elements;
second display elements on the second display area and corresponding respectively to the pixel groups, and second pixel circuits respectively coupled to the second display elements, each of the second display elements comprise a pixel electrode, a emission layer, and a counter electrode; and a lower metal layer in the second display area, and between the substrate and the second pixel circuits, wherein the counter electrode has a transmission hole corresponding to the transmission area, and the lower metal layer has a lower-hole corresponding to the transmission area, and the transmission hole overlaps the lower-hole in a plan view.

13. The display apparatus of claim 12, wherein an entire area of the lower-hole is smaller than an entire area of the transmission hole.

14. The display apparatus of claim 12, wherein the lower metal layer is disposed to correspond to the entire second display area except the lower-hole corresponding to the transmission area.

15. The display apparatus of claim 12, further comprising an inorganic insulating layer disposed on the substrate, wherein the inorganic insulating layer has a first hole or a groove corresponding to the transmission area TA.

16. The display apparatus of claim 12, wherein the first hole or the groove overlaps the lower-hole.

17. The display apparatus of claim 12, further comprising:

first bypass wirings electrically coupling the first pixel circuits in a first direction, and bypassing along one side of one of the pixel groups at an outermost portion of a second display area; and horizontal wirings electrically coupled to the first pixel circuits and the second pixel circuits and extending in the first direction.

18. The display apparatus of claim 17, further comprising:

extension wirings between two pixel groups adjacent to each other along the first direction, and extending in the first direction, wherein the extension wirings are electrically coupled to the horizontal wirings included in each of the two pixel groups, and the number of the extension wirings is less than the number of the horizontal wirings.

19. The display apparatus of claim 17, further comprising second bypass wires that electrically couple the first pixel circuits in a second direction that intersects the first direction, and that bypass along one side of a pixel group at an outermost portion of the second display area.

20. The display apparatus of claim 12, wherein the component is a camera.

\* \* \* \* \*